United States Patent
Yu et al.

(10) Patent No.: US 11,307,613 B2
(45) Date of Patent: *Apr. 19, 2022

(54) DISPLAY DEVICE

(71) Applicant: Samsung Display Co., Ltd., Yongin-si (KR)

(72) Inventors: Jae Young Yu, Asan-si (KR); Yong Gi Ko, Asan-si (KR); Bon Joo Koo, Cheonan-si (KR); Yun Ha Kim, Cheonan-si (KR); Jae Chun Park, Seoul (KR); Nam Seok Baik, Seongnam-si (KR); Mikiya Itakura, Suwon-si (KR); Hyoung Jin Lee, Cheonan-si (KR); Dae Guen Choi, Cheonan-si (KR); Sung Chul Choi, Hwaseong-si (KR)

(73) Assignee: SAMSUNG DISPLAY CO., LTD., Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/099,377

(22) Filed: Nov. 16, 2020

(65) Prior Publication Data
US 2021/0072791 A1 Mar. 11, 2021

Related U.S. Application Data

(63) Continuation of application No. 16/743,900, filed on Jan. 15, 2020, now Pat. No. 10,838,457.

(30) Foreign Application Priority Data

Jan. 16, 2019 (KR) .................. 10-2019-0005606

(51) Int. Cl.
*G06F 1/16* (2006.01)

(52) U.S. Cl.
CPC .......... *G06F 1/1616* (2013.01); *G06F 1/1656* (2013.01)

(58) Field of Classification Search
CPC combination set(s) only.
See application file for complete search history.

(56) References Cited

U.S. PATENT DOCUMENTS 9,348,450 B1 * 5/2016 Kim ...................... G06F 1/1681
9,557,771 B2 * 1/2017 Park ...................... G06F 1/1681
(Continued)

FOREIGN PATENT DOCUMENTS

KR 1020180036323 4/2018
KR 1020180047603 5/2018

OTHER PUBLICATIONS

Extended European Search Report—European Application No. 19219269.8 dated May 19, 2020, references cited within.

*Primary Examiner* — Lisa Lea-Edmonds
(74) *Attorney, Agent, or Firm* — Cantor Colburn LLP

(57) ABSTRACT

A display device is provided. The display device includes a display panel including a folding region, first and second non-folding regions at opposite sides of the folding region; a first support plate below the display panel to overlap the first non-folding region and to partially overlap the folding region; a second support plate below the display panel to overlap the second non-folding region and to partially overlap the folding region; a first plate coupling film between the display panel and the first support plate to overlap the first non-folding region; a second plate coupling film between the display panel and the second support plate to overlap the second non-folding region; a first step compensating member between the display panel and the first support plate to overlap the folding region, apart from the first plate coupling film, and including a light shielding layer; and a second step compensating member between the (Continued)

display panel and the second support plate to overlap the folding region, apart from the second plate coupling film, and including a light shielding layer.

11 Claims, 31 Drawing Sheets

(56) References Cited

U.S. PATENT DOCUMENTS

| | | | |
|---|---|---|---|
| 9,651,998 B2 | 5/2017 | Matsueda | |
| 9,905,795 B2 | 2/2018 | Matsueda | |
| 9,992,888 B2 * | 6/2018 | Moon | H05K 5/0226 |
| 10,331,173 B2 * | 6/2019 | Cho | G09F 9/301 |
| 10,600,991 B2 | 3/2020 | Kwon et al. | |
| 10,620,668 B2 * | 4/2020 | Park | G06F 1/1681 |
| 10,684,650 B2 | 6/2020 | Sim et al. | |
| 2015/0055287 A1 | 2/2015 | Seo | |
| 2016/0007441 A1 | 1/2016 | Matsueda | |
| 2016/0172623 A1 | 6/2016 | Lee | |
| 2017/0098796 A1 | 4/2017 | Yee | |
| 2018/0102496 A1 | 4/2018 | Kim et al. | |
| 2019/0025887 A1 | 1/2019 | Seo et al. | |
| 2019/0036068 A1 | 1/2019 | Kim et al. | |
| 2019/0074469 A1 | 3/2019 | Kwon et al. | |
| 2019/0079561 A1 | 3/2019 | Park et al. | |
| 2019/0369668 A1 * | 12/2019 | Kim | G06F 1/1681 |
| 2020/0019212 A1 * | 1/2020 | Jung | G06F 1/1652 |
| 2020/0057471 A1 * | 2/2020 | Nam | H05K 5/0017 |
| 2020/0133344 A1 | 4/2020 | Park et al. | |
| 2020/0166972 A1 | 5/2020 | Park et al. | |
| 2020/0204666 A1 | 6/2020 | Hong | |

* cited by examiner

FIG. 30
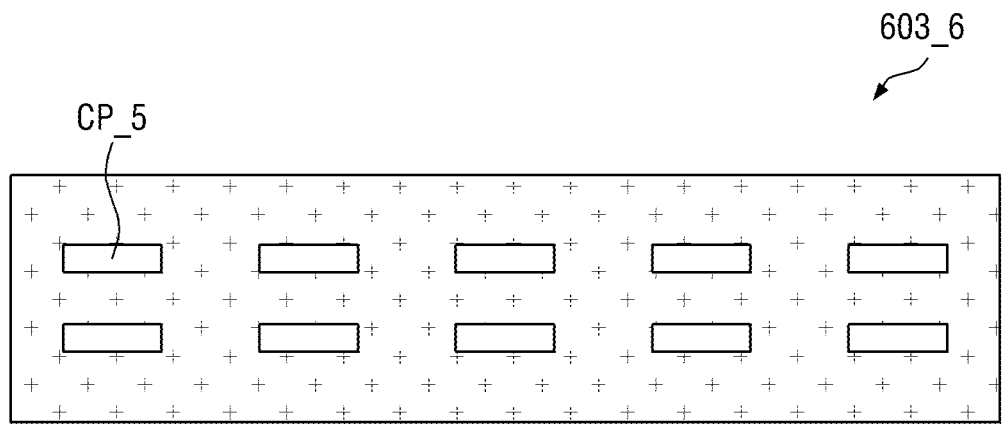
FIG. 31
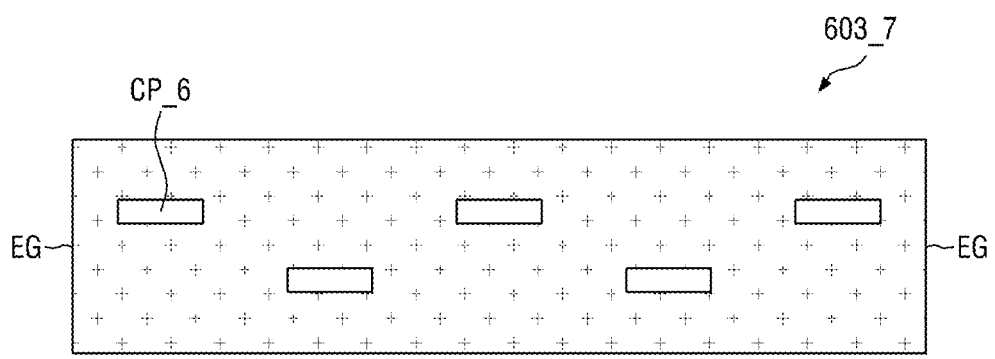
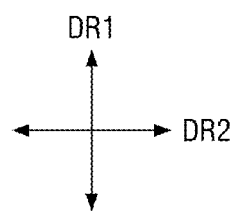

DISPLAY DEVICE

This application is a continuation of U.S. patent application Ser. No. 16/743,900, filed on Jan. 15, 2020, which claims priority to Korean Patent Application No. 10-2019-0005606, filed on Jan. 16, 2019, and all the benefits accruing therefrom under 35 U.S.C. § 119, the content of which in its entirety is herein incorporated by reference.

BACKGROUND

1. Field

The disclosure relates to a display device, and more particularly, to a foldable display device configured to be in a folded state and an unfolded state.

2. Description of the Related Art

A display device is a device for displaying an image and includes a display panel such as an organic light emitting display panel or a liquid crystal display panel. The display device is typically applied to mobile electronic devices such as a smartphone and a tablet personal computer ("PC") as well as large-sized electronic devices such as a television and a monitor to provide a user with an image. In recent years, demand for mobile electronic devices having a relatively large display screen while having a relatively small volume or thickness has been increasing, and a foldable display device or a bendable display device having a structure capable of being folded and unfolded has also been developed so as to provide a larger screen only during use.

SUMMARY

Embodiments of the disclosure provide a display device in which pattern visibility in a folded or bent region is reduced.

In an embodiment of the invention, a display device includes: a display panel including a folding region, a first non-folding region disposed at a side of the folding region, and a second non-folding region disposed at another side of the folding region; a first support plate disposed below the display panel to overlap the first non-folding region and to partially overlap the folding region; a second support plate disposed below the display panel to overlap the second non-folding region and to partially overlap the folding region; a first plate coupling film disposed between the display panel and the first support plate to overlap the first non-folding region, where the first plate coupling film couples the display panel and the first support plate to each other; a second plate coupling film disposed between the display panel and the second support plate to overlap the second non-folding region, where the second plate coupling film couples the display panel and a second support plate to each other; a first step compensating member disposed between the display panel and the first support plate to overlap the folding region, spaced apart from the first plate coupling film, and including a first light shielding layer; and a second step compensating member disposed between the display panel and the second support plate to overlap the folding region, spaced apart from the second plate coupling film, and including a second light shielding layer.

In an embodiment, the display device may further include a lower cover panel disposed between the display panel and the first plate coupling film to overlap the folding region, the first non-folding region and the second non-folding region.

In an embodiment, when the display device is folded, the first non-folding region and the second non-folding region may be disposed to overlap each other.

In an embodiment, when the display device is folded, the first step compensating member may be separated from the lower cover panel and attached to the first support plate, and the second step compensating member may be separated from the lower cover panel and attached to the second support plate.

In an embodiment, a separation distance between the first plate coupling film and the second plate coupling film may be in a range of about 7 millimeters (mm) to about 8 mm.

In an embodiment, a separation distance between the first plate coupling film and a first side surface of the first step compensating member facing an inner side surface of the first plate coupling film may be in a range of about 300 micrometers (μm) to about 800 μm, and a separation distance between the second plate coupling film and a first side surface of the second step compensating member facing an inner side surface of the second plate coupling film may be in a range of about 300 μm to about 800 μm.

In an embodiment, a separation distance between a second side surface of the first step compensating member facing the first side surface thereof and a second side surface of the second step compensating member facing the first side surface thereof may be in a range of about 0.2 mm to about 0.4 mm.

In an embodiment, when viewed in a plan view, a first width of the first step compensating member between the inner side surface of the first plate coupling film and an inner side surface of the first support plate may be in a range of about 3.0 mm to about 3.3 mm. In such an embodiment, when viewed in a plan view, a second width of the second step compensating member between the inner side surface of the second plate coupling film and an inner side surface of the second support plate may be in a range of about 3.0 mm to about 3.3 mm.

In an embodiment, a second side surface of the first step compensating member facing the first side surface thereof may be aligned with or disposed more inward than the inner side surface of the first support plate when viewed in a plan view in a thickness direction of the first support plate, and the second side surface of the second step compensating member facing the first side surface thereof may be aligned with or disposed more inward than the inner side surface of the second support plate when viewed in a plan view in a thickness direction of the second support plate.

In an embodiment, the first step compensating member may further include a first step compensating coupling film and a first step compensating substrate, and the second step compensating member may further include a second step compensating coupling film and a second step compensating substrate.

In an embodiment, the first step compensating coupling film may be disposed between the first support plate and the first step compensating substrate to directly couple the first support plate and the first step compensating substrate to each other, where the first light shielding layer may be disposed between the first step compensating substrate and the lower cover panel and be directly printed on a surface of the first step compensating substrate. In such an embodiment, the second step compensating coupling film may be disposed between the second support plate and the second step compensating substrate to directly couple the second support plate and the second step compensating substrate to each other, where the second light shielding layer may be disposed between the second step compensating substrate and the lower cover panel and be directly printed on an upper surface of the second step compensating substrate.

In an embodiment, an elastic modulus of the first step compensating coupling film may be greater than an elastic modulus of the first plate coupling film, and an elastic modulus of the second step compensating coupling film may be greater than an elastic modulus of the second plate coupling film.

In an embodiment, each of the elastic modulus of the first plate coupling film and the elastic modulus of the second plate coupling film may be in a range of about 0.03 megapascal (MPa) to about 0.06 MPa.

In an embodiment, the first step compensating coupling film may be disposed between the first support plate and the first light shielding layer to directly couple the first support plate and the first light shielding layer to each other, where the first step compensating substrate may be disposed between the first light shielding layer and a lower cover panel. In such an embodiment, the second step compensating coupling film may be disposed between the second support plate and the second light shielding layer to directly couple the second support plate and the second light shielding layer to each other, where the second step compensating substrate may be disposed between the second light shielding layer and the lower cover panel.

In an embodiment, the first step compensating coupling film may be disposed between the first light shielding layer and the first step compensating substrate to directly couple the first light shielding layer and the first step compensating substrate each other, where the first step compensating substrate may be disposed between a lower cover panel and the first step compensating coupling film, and the first light shielding layer may be directly printed on one surface of the first support plate. In such an embodiment, the second step compensating coupling film may be disposed between the second light shielding layer and the second step compensating substrate to directly couple the second light shielding layer and the second step compensating substrate to each other, where the second step compensating substrate may be disposed between the lower cover panel and the second step compensating coupling film, and the second light shielding layer may be directly printed on an upper surface of the second support plate.

In an embodiment, the first step compensating coupling film may be disposed between the first support plate and the first step compensating substrate to directly couple the first support plate and the first step compensating substrate to each other, where a material of the first light shielding layer may be dispersed inside the first step compensating coupling film, and the first step compensating substrate may be disposed between the first step compensating coupling film and the lower cover panel. In such an embodiment, the second step compensating coupling film may be disposed between the second support plate and the second step compensating substrate to directly couple the second support plate and the second step compensating substrate to each other, where a material of the second light shielding layer may be dispersed inside the second step compensating coupling film, and the second step compensating substrate may be disposed between the second step compensating coupling film and the lower cover panel.

In an embodiment, each of the first light shielding layer and the second light shielding layer may include a black ink.

In an embodiment, each of the first light shielding layer and the second light shielding layer may include an opaque inorganic material or an opaque organic material.

In an embodiment, each of the first step compensating member and the second step compensating member may include a black one-sided tape.

In another embodiment of the invention, a display device includes: a display panel including a folding region, a first non-folding region disposed at a side of the folding region, and a second non-folding region disposed at another side of the folding region; a first support plate disposed below the display panel to overlap the first non-folding region and to partially overlap the folding region; a second support plate disposed below the display panel to overlap the second non-folding region and to partially overlap the folding region; a first plate coupling film disposed between the display panel and the first support plate to overlap the first non-folding region, where the first plate coupling film couples the display panel and the first support plate to each other; a second plate coupling film disposed between the display panel and the second support plate to overlap the second non-folding region, where the second plate coupling film couples the display panel and a second support plate to each other; and a step compensating member disposed between the display panel and the first support plate and the second support plate, and spaced apart from the first plate coupling film and the second plate coupling film, where the step compensating member is integrally formed as a single body and includes a light shielding layer.

In an embodiment, the display device may further include a lower cover panel disposed between the display panel and the first plate coupling film to overlap the folding region, the first non-folding region and the second non-folding region.

In an embodiment, when the display device is folded, the first non-folding region and the second non-folding region may be disposed to overlap each other, and the step compensating member may be attached to the lower cover panel and be separated from the first support plate and the second support plate.

In an embodiment, when viewed in a plan view, the step compensating member may be disposed to extend in a boundary direction of the first non-folding region and the folding region.

In an embodiment, the step compensating member may include a cutting pattern defined in a thickness direction from a surface, and the cutting pattern may have a linear shape extending in the boundary direction when viewed in the plan view.

In an embodiment, the step compensating member may further include a step compensating coupling film and a step compensating substrate, where the step compensating coupling film may be disposed between the first and second support plates and the step compensating substrate, the light shielding layer may be disposed between the step compensating substrate and the lower cover panel, and the cutting pattern may cross the light shielding layer and at least a portion of the step compensating substrate in the thickness direction.

In an embodiment, a separation distance between the first plate coupling film and a first side surface of the step compensating member facing an inner side surface of the first plate coupling film may be in a range of about 300 μm to about 800 μm, and a separation distance between the second plate coupling film and a second side surface of the step compensating member facing an inner side surface of the second plate coupling film may be in a range of about 300 μm to about 800 μm.

In an embodiment, the light shielding layer may include a black ink.

In an embodiment, the light shielding layer may include an opaque inorganic material or an opaque organic material.

In an embodiment, the step compensating member may include a black one-sided tape.

The details of other embodiments are incorporated in the detailed description and the accompanying drawings.

BRIEF DESCRIPTION OF THE DRAWINGS

The above and other features of the disclosure will become more apparent by describing in detail exemplary embodiments thereof with reference to the attached drawings, in which:

FIG. 30 is a plan view of a step compensating member according to yet another alternative embodiment;

FIG. 31 is a plan view of a step compensating member according to yet another alternative embodiment;

DETAILED DESCRIPTION OF THE EMBODIMENTS

Figure 1:
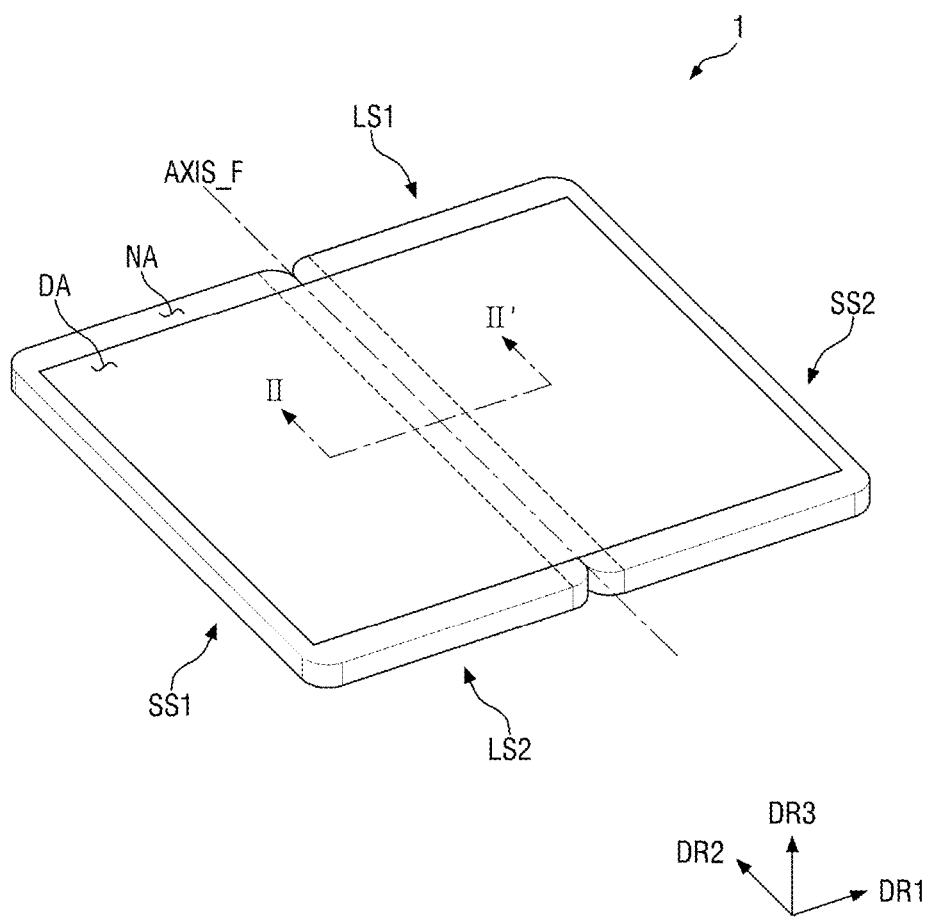
FIG. 1 is a perspective view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

Figure 2:
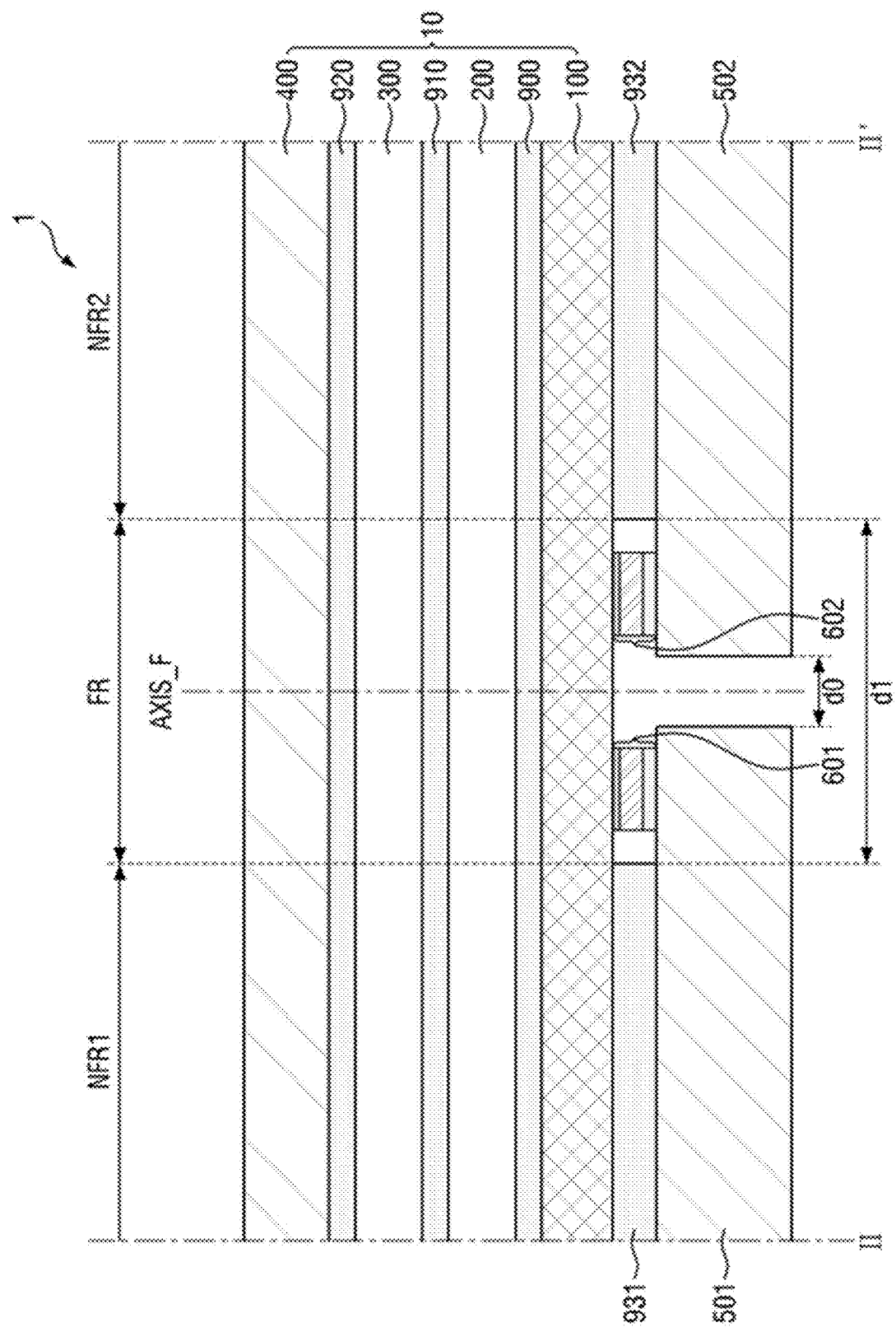
FIG. 2 is a cross-sectional view taken along line II-IF of FIG. 1.
Figure 3:
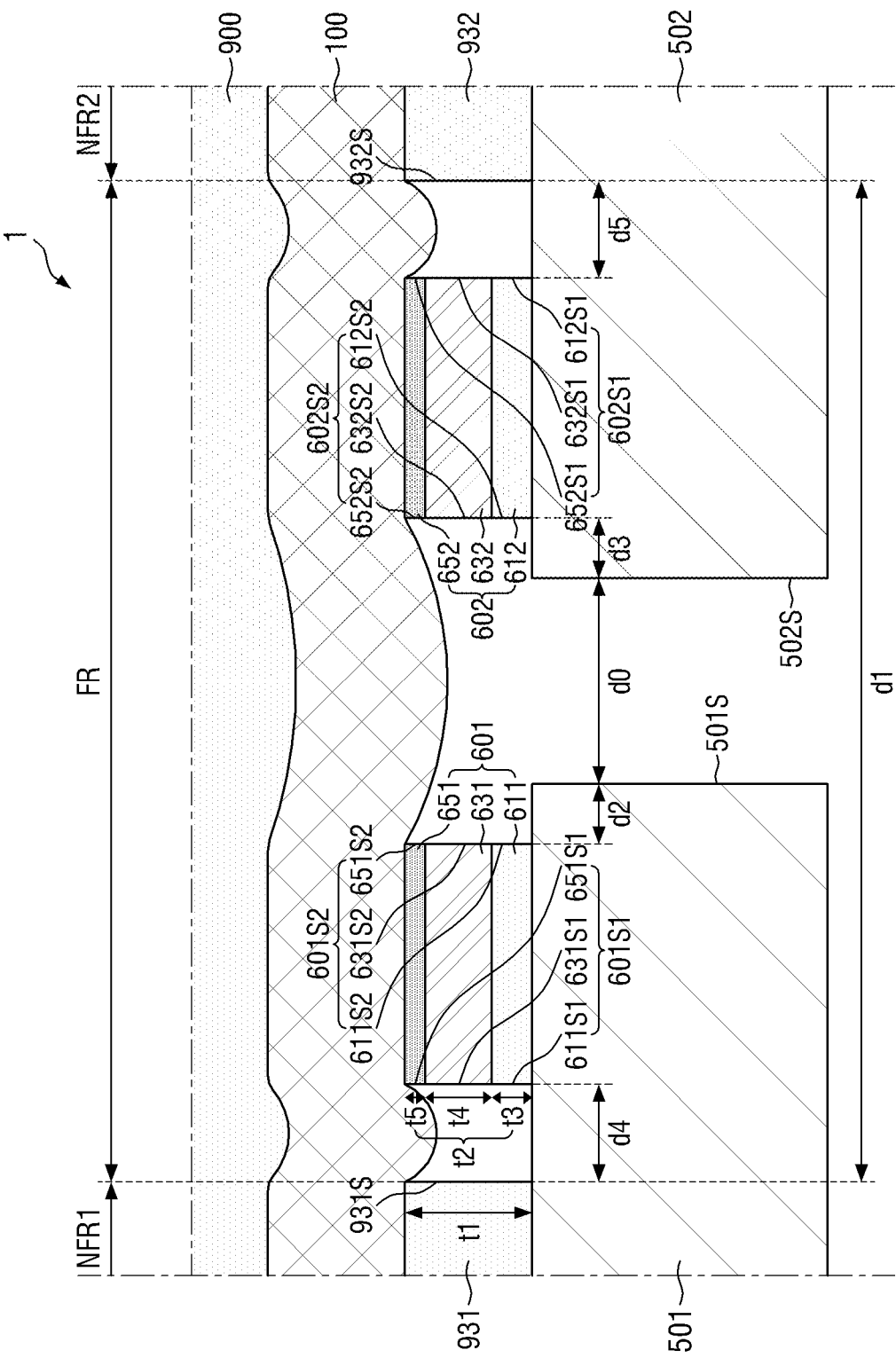
FIG. 3 is a view illustrating a lower surface (or a back surface) of a display module of the display device.
Figure 4:
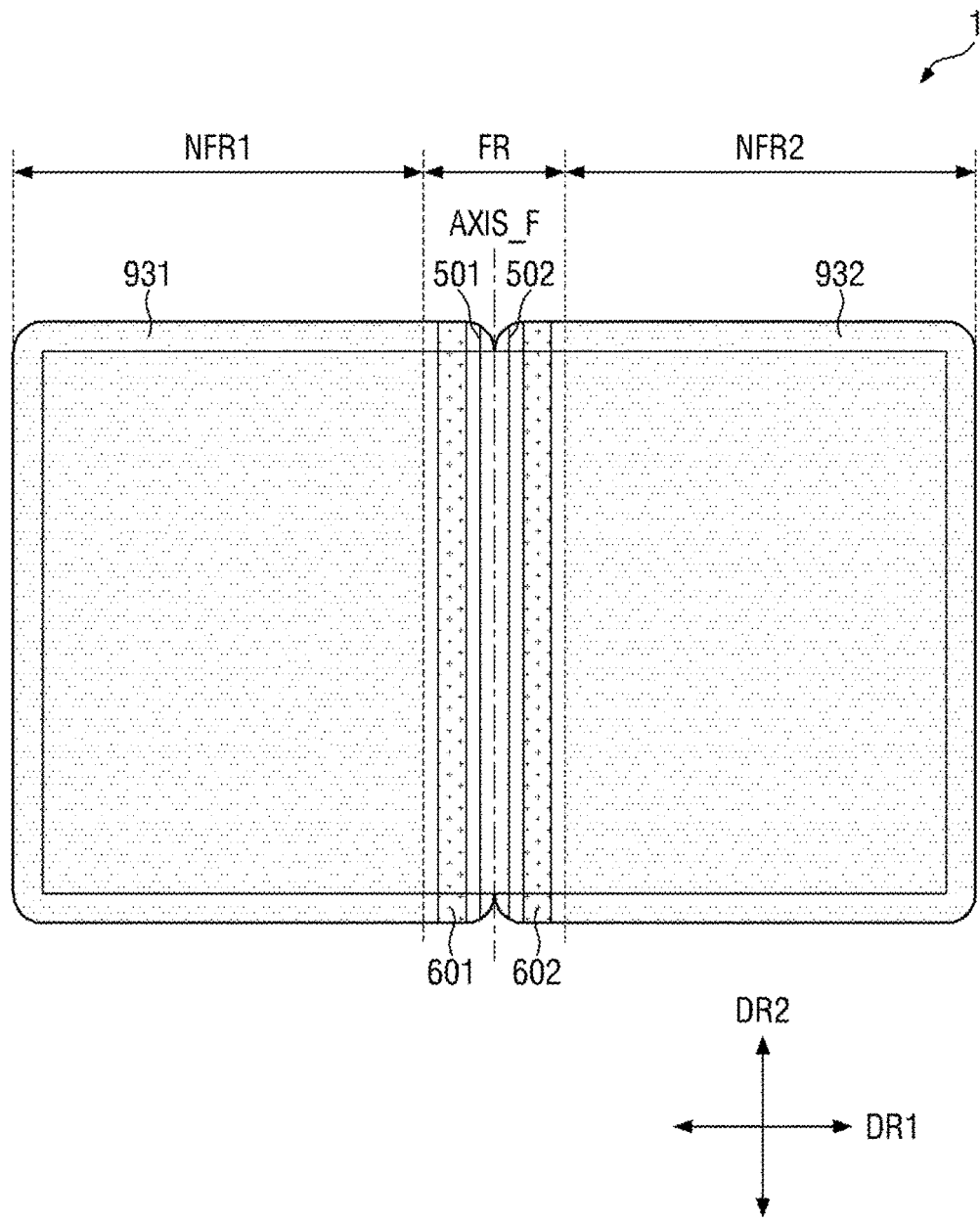
FIG. 4 is a plan view of the display device according to an embodiment.
Figure 5:
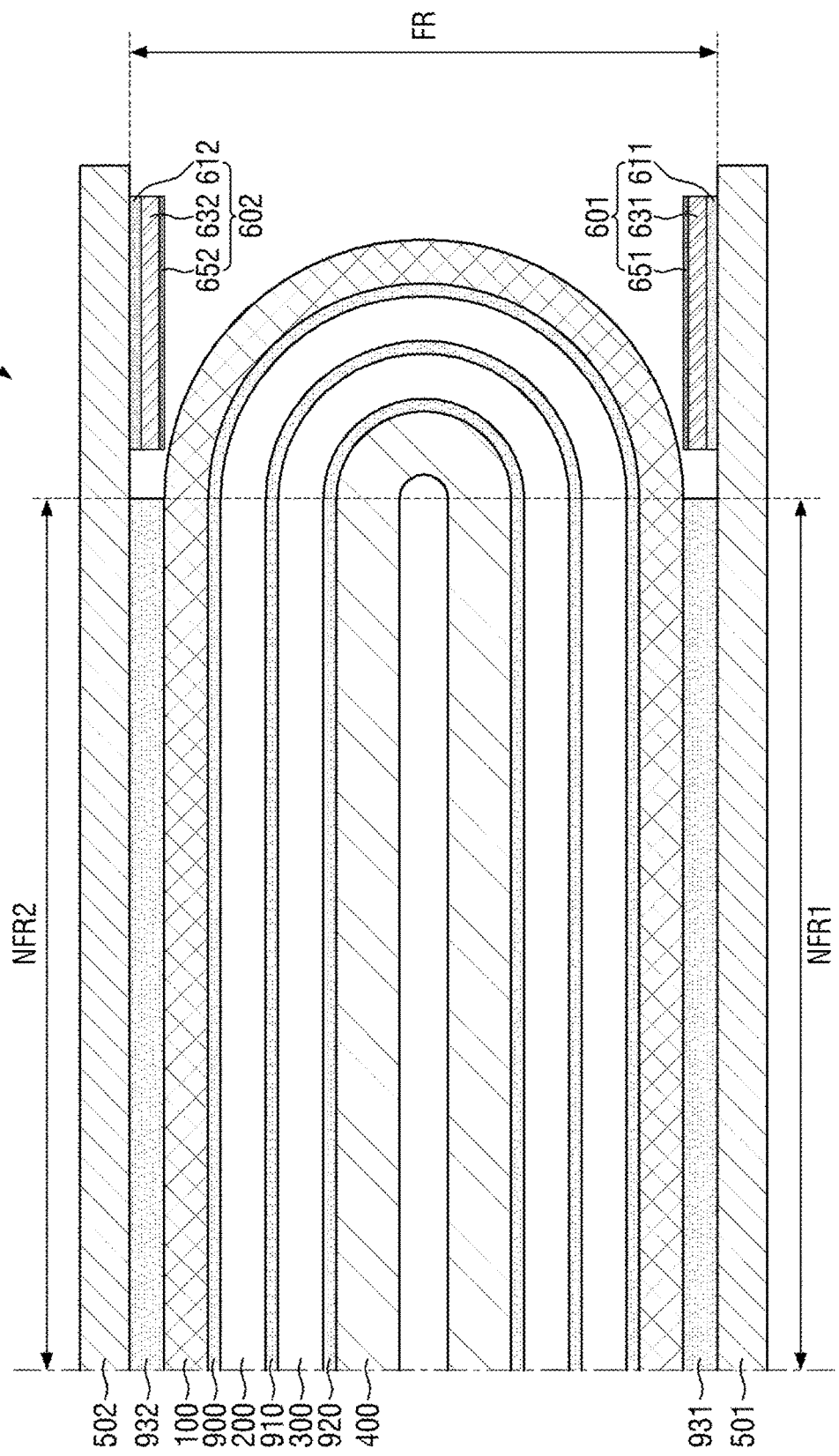
FIG. 5 is a view illustrating a folded state of the display device according to an embodiment.
Figure 6:
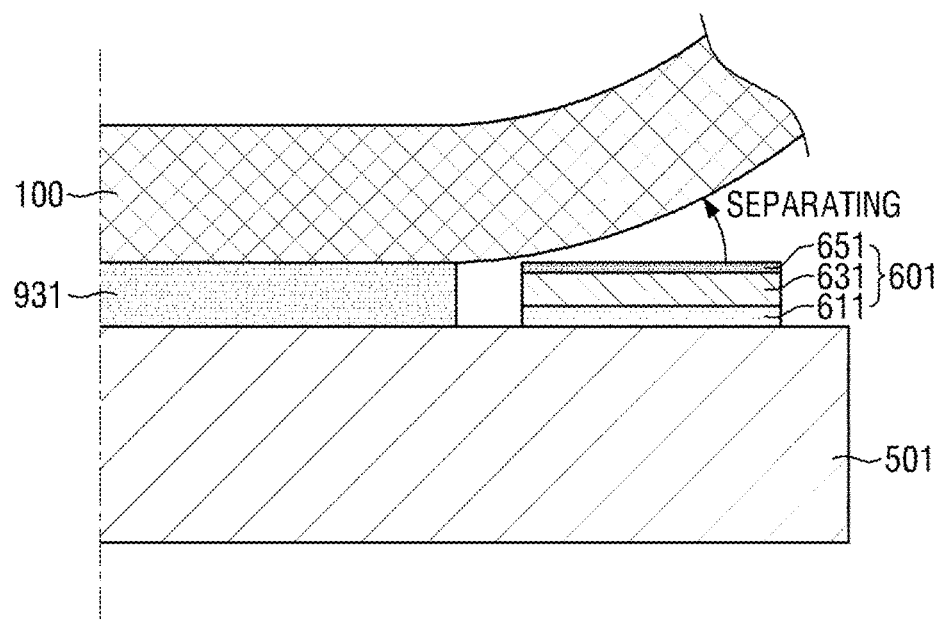
FIG. 6 is a view illustrating changing of a state of the display device from an unfolded state to a folded state according to an embodiment.

FIG. 1 is a perspective view of a display device according to an embodiment, FIG. 2 is a cross-sectional view taken along line II-IF of FIG. 1, FIG. 3 is a view illustrating a lower surface (or a back surface) of a display module of the display device, FIG. 4 is a plan view of the display device according to an embodiment, FIG. 5 is a view illustrating a folded state of the display device according to an embodiment, and FIG. 6 is a view illustrating changing of a state of the display device from an unfolded state to a folded state according to an embodiment.

Referring to FIGS. 1 to 6, an embodiment of a display device 1 is a device for displaying a video or a still image and may be used as a display screen of various products or devices such as a television, a laptop, a monitor, a billboard, the Internet of Things, as well as portable electronic devices such as a mobile phone, a smartphone, a tablet personal computer ("PC"), a smartwatch, a watch phone, a mobile communication terminal, an electronic organizer, an electronic book, a portable multimedia player ("PMP"), a navigation, and an ultra-mobile PC ("UMPC").

The display device 1 of an embodiment may be a foldable display device. Herein, "foldable" may indicate a flexible state. Specifically, "foldable" is a term that includes meanings of being bendable, rollable, or the like. Further, "foldable" should be interpreted including all meanings of being "partially" foldable, "entirely" foldable, "inwardly" foldable, and "outwardly" foldable.

The display device 1 may include a folding axis AXIS_F that crosses the display device 1 through a vertical side thereof (for example, in a second direction DR2) in a plan view (or a plan view in a thickness direction of the display device 1 or a third direction DR3). The display device 1 may be folded along the folding axis AXIS_F.

The display device 1 may be in a substantially rectangular shape in the plan view. The display device 1 may have a rectangular shape with right-angled corners or rounded corners in the plan view. The display device 1 may include four edges (or sides) LS1, LS2, SS1 and SS2. The display device 1 may include long side edges LS1 and LS2 and short side edges SS1 and SS2. In one embodiment, for example, each of the long side edges LS1 and LS2 may extend in a first direction DR1, and each of the short side edges SS1 and SS2 may extend in the second direction DR2, but not being limited thereto. Alternatively, the planar shape of the display device 1 may be other shapes such as a square shape and a circular shape.

In an embodiment, as illustrated in FIG. 1, the folding axis AXIS_F extends in a direction crossing each of the long side edges LS1 and LS2, e.g., in the second direction DR2, and each of the long side edges LS1 and LS2 of the display device 1 may be folded. Alternatively, the folding axis AXIS_F may extend in a direction crossing each of the short side edges SS1 and SS2, and each of the short side edges SS1 and SS2 of the display device 1 may be folded. Hereinafter, for convenience of description, embodiments in which the folding axis AXIS_F extends by crossing each of the long side edges LS1 and LS2 will be described in detail. The folding axis AXIS_F may cross a central portion of each of the long side edges LS1 and LS2, but embodiments are not limited thereto.

Herein, unless defined otherwise, in the specification, "upper portion" and "upper surface" in a thickness direction refer to a display direction, and "lower portion" and "lower surface" refer to a direction opposite to the display direction. Also, "up (above)," "down (below)," left (to the left of)," and "right (to the right of)" in the plan view indicate directions viewed from the top when a display surface is in a regular position.

The display device 1 may include a display area DA and a non-display area NA disposed around the display area DA. The display area DA is an area in which a screen is displayed, and the non-display area NA is an area in which the screen is not displayed. The display area DA may be disposed at a central portion of the display device 1. In a state in which the display device 1 is folded, regions of the display area DA divided by the folding axis AXIS_F may overlap each other. In a state in which the display device 1 is unfolded, the screen may be displayed in the display area DA while the regions thereof are unfolded.

In the plan view, grooves (for example, notches) concave downward/upward may be respectively defined in regions adjacent to the first long side LS1 and the second long side LS2 of the display device 1 at a position corresponding to the folding axis AXIS_F, and a hinge member (not illustrated) for changing a state may be coupled to the groove, but embodiments are not limited thereto.

Referring to FIG. 2, an embodiment of the display device 1 may be divided into a folding region FR and non-folding regions NFR1 and NFR2 about the folding axis AXIS_F. In such an embodiment, the display device 1 may include the folding region FR disposed at a central region and overlapping the folding axis AXIS_F and the non-folding regions NFR1 and NFR2 spaced apart from each other with the folding region FR disposed therebetween.

The folding region FR may be a region in which the display device 1 is folded or bent with a predetermined curvature in a folding direction, and the non-folding regions NFR1 and NFR2 may be regions in which the display device 1 is not folded. The non-folding regions NFR1 and NFR2 may be formed of flat surfaces disposed on a same plane, but embodiments are not limited thereto. Alternatively, the non-folding regions NFR1 and NFR2 may be partially bent.

In an embodiment, as illustrated in FIG. 2, the display device 1 includes a display module 10. The display module 10 may include a plurality of stacked panels and/or members. The display module 10 may include a display panel 200, a lower cover panel 100 disposed at a lower side of the display panel 200, an upper cover member 300 disposed at an upper side of the display panel 200, and a window 400 disposed at an upper side of the upper cover member 300.

The lower cover panel 100 may be disposed on a bottom surface of the display module 10. The lower cover panel 100 may include at least one functional layer. The functional layer may be a layer that performs an impact absorbing function, a heat dissipating function, an electromagnetic shielding function, a grounding function, a reinforcing function, a supporting function, a pressure sensing function or a digitizing function, for example. The lower cover panel 100 may be formed of a single layer, but embodiments are not limited thereto. Alternatively, the lower cover panel 100 may have a multilayer structure including different functional layers stacked one on another. In one embodiment, for example, the lower cover panel 100 may include an impact absorbing member. The impact absorbing member may effectively prevent an impact applied from the outside (for example, in a downward direction of the lower cover panel 100) from being transmitted to the display panel 200. The impact absorbing member may include or be formed of a foam material. In one embodiment, for example, the impact absorbing member may include polyurethane ("PU"), thermoplastic polyurethane ("TPU"), silicone, polydimethylacrylamide ("PDMA"), or a combination thereof.

In an embodiment, the lower cover panel 100 may have a lower light transmittance than a plurality of members disposed at the upper side of the display panel 200 which will be described below. In such an embodiment, layers at the upper side of the display panel 200 may have a relatively high light transmittance and transmit light emitted from the display area DA of the display panel 200 upward. In such an embodiment, the lower cover panel 100 may have a relatively low light transmittance and shield light projected downward from the display area DA of the display panel 200.

The display panel 200 may be disposed on the lower cover panel 100.

The display panel 200 may display an image corresponding to an input data signal. The display panel 200 may include an organic light emitting display panel, a liquid crystal display panel, a plasma display panel, an electrophoretic display panel, an electro-wetting display panel, a quantum dot light emitting display panel or a micro light emitting diode ("LED") display panel, for example. In one embodiment, for example, the display panel 200 may be an organic light emitting display panel.

In an embodiment, the display panel 200 may include a flexible substrate including a flexible, macromolecular material such as polyimide ("PI"). Accordingly, the display panel 200 may be bent, folded, or rolled. The display panel 200 may have a shape that is substantially the same as or similar to the planar shape of the display device 1.

A plurality of pixels may be disposed in the display area DA of the display panel 200, and signal wires or driving circuits for applying a signal to each pixel may be disposed in the non-display area NA.

The pixel may include a light emitting layer and a circuit layer configured to control a light emitting amount of the light emitting layer. The circuit layer may include a plurality of wires, a plurality of electrodes, and at least one transistor. The light emitting layer may include an organic light emitting material. The light emitting layer may be sealed by an encapsulation film. The encapsulation film may seal the light emitting layer and prevent introduction of moisture or the like from the outside. The encapsulation film may be formed of a single inorganic film or multiple inorganic films or formed of stacked films in which an inorganic film and an organic film are alternately stacked one on another.

The upper cover member 300 may be disposed at the upper side of the display panel 200.

In an embodiment, the upper cover member 300 may be disposed to overlap the display panel 200 to partially or entirely cover the display area DA of the display panel 200. In an embodiment, the upper cover member 300 may cover the non-display area NA of the display panel 200 or may be disposed to cover both the display area DA and the non-display area NA. The upper cover member 300 may include at least one of various functional members. In one embodiment, for example, the upper cover member 300 may include a polarizing plate or a polarizing member having a polarizing function, a touch panel or a touch module having a touch sensing function, a color filter, a color conversion film, an optical film, a reflection preventing member, and/or a biometric member such as a fingerprint recognition sensor.

The window 400 may be disposed at an upper side of the upper cover member 300.

The window 400 serves to cover and protect the configurations 100, 200, and 300 disposed at a lower side thereof. The window 400 may include or be formed of a glass, quartz or a transparent plastic, for example. A thickness of the window 400 may be less than 100 micrometers (μm). In an embodiment, where the thickness of the window 400 is less than about 100 μm, stress when the display device 1 is folded may be low, and, even when a folded state and an unfolded state are repeatedly changed one from another, a degree to which a structure of the display device 1 is deformed may be negligible. In some embodiments, a flexible window may be applied as the window 400, and the window 400 may be folded together with the display panel 200 when the display device 1 is folded. In such embodiments, the window 400 may include a flexible ultra-thin glass ("UTG") or a transparent plastic.

The display module 10 may further include a plurality of coupling layers 900, 910 and 920 disposed between the elements or layers thereof 100, 200, 300 and 400 to couple the elements or layers 100, 200, 300 and 400 to each other. A first coupling layer 900 may be disposed between the lower cover panel 100 and the display panel 200 to couple the lower cover panel 100 and the display panel 200 to each other, a second coupling layer 910 may be disposed between the display panel 200 and the upper cover member 300 to couple the display panel 200 and the upper cover member 300 to each other, and a third coupling layer 920 may be disposed between the upper cover member 300 and the window 400 to couple the upper cover member 300 and the window 400 to each other.

The plurality of coupling layers 900, 910 and 920 described above may be films in which both an upper surface and a lower surface have an adhesive property. In one embodiment, for example, each of the coupling layers 900, 910, and 920 may include or be formed of a press sensitive adhesive ("PSA"), an optical clear adhesive ("OCA"), or an optical clear resin ("OCR"). Each of the coupling layers 900, 910, and 920 may include an acrylic resin or silicone resin. In an embodiment, each of the coupling layers 900, 910, and 920 may have an elongation in a range of about 100% to about 1,000%.

In an embodiment, the display device 1 may further include support plates 501 and 502, plate coupling films 931 and 932, and step compensating members 601 and 602 which are disposed at a lower side of the lower cover panel 100.

The support plates 501 and 502 may prevent the display panel 200 from being bent due to an external force or mitigate the degree to which the display panel 200 is bent (for example, an angle at which the display panel 200 is bent, a radius of curvature at which the display panel 200 is bent) due to the external force. In such an embodiment, the support plates 501 and 502 may maintain the display panel 200 in a relatively flat state even when an external force is applied to the display panel 200.

The support plates 501 and 502 may include a rigid or semi-rigid material. In an embodiment, the support plates 501 and 502 may include a metal material such as stainless use steel ("SUS"), aluminum, and a polymer, such as polymethyl methacrylate ("PMMA"), polycarbonate ("PC"), polyvinylalcohol ("PVA"), acrylonitrile-butadiene-styrene ("ABS") and polyethylene terephthalate ("PET"). In one embodiment, for example, the support plates 501 and 502 may include an aluminum film having a thickness in a range of about 150 µm to about 200 µm. In one alternative embodiment, for example, the support plates 501 and 502 may include an SUS film having a thickness in a range of about 150 µm to about 200 µm.

The support plates 501 and 502 may include a first support plate 501 and a second support plate 502 spaced apart from each other. The first support plate 501 may be disposed to overlap a first non-folding region NFR1 and disposed to overlap a portion of the folding region FR. The second support plate 502 may be disposed to overlap a second non-folding region NFR2 and disposed to overlap a portion of the folding region FR. The first support plate 501 and the second support plate 502 may be disposed to be spaced apart from each other about the folding axis AXIS_F. A separation space between the first support plate 501 and the second support plate 502 may overlap the folding region FR. A separation distance d0 between the first support plate 501 and the second support plate 502 may be in a range of about 70 µm to about 120 µm. In one embodiment, for example, the separation distance d0 between the first support plate 501 and the second support plate 502 may be about 100 µm.

First and second plate coupling films 931 and 932 may be disposed between the lower cover panel 100 and the support plates 501 and 502. The first and second plate coupling films 931 and 932 may be disposed to overlap the non-folding regions NFR1 and NFR2, respectively. In such an embodiment, the first plate coupling film 931 may overlap the first non-folding region NFR1, and the second plate coupling film 932 may overlap the second non-folding region NFR2. The first plate coupling film 931 and the second plate coupling film 932 may be disposed to be spaced apart from each other with the folding region FR disposed therebetween. Inner side surfaces 931S and 932S of the first and second plate coupling films 931 and 932 may be aligned along boundaries between the folding region FR and each of the non-folding regions NFR1 and NFR2.

In an embodiment, as illustrated in FIG. 2, the first and second plate coupling films 931 and 932 may be spaced apart from each other by a first separation distance d1 and expose the folding region FR of the support plates 501 and 502. In one embodiment, for example, the first separation distance d1 may be in a range of about 7 mm to about 8 mm, but embodiments are not limited thereto. In one embodiment, for example, the first separation distance d1 may be about 7.5 mm.

In the non-folding regions NFR1 and NFR2, the first and second plate coupling films 931 and 932 respectively couple the support plates 501 and 502 to the lower cover panel 100. The first and second plate coupling films 931 and 932 may include at least one selected form materials described above for the coupling layers 900, 910 and 920. In one embodiment, for example, the first and second plate coupling films 931 and 932 may include or be formed of the PSA, but embodiments are not limited thereto.

In an embodiment, as described above, the first and second plate coupling films 931 and 932 may be films which are separate from the display module 10, but embodiments are not limited thereto. Alternatively, the first and second plate coupling films 931 and 932 may defined by or correspond to configurations included in the display module 10 and disposed at a bottom portion (e.g., a lowermost portion) of the display module 10.

The step compensating members 601 and 602 may be disposed between the lower cover panel 100 and the support plates 501 and 502. In an embodiment, the step compensating members 601 and 602 may be disposed between the lower cover panel 100 and the support plates 501 and 502 respectively exposed by the first and second plate coupling films 931 and 932.

In such an embodiment, a first step compensating member 601 of the step compensating members 601 and 602 may be disposed between the lower cover panel 100 and the first support plate 501 in the folding region FR, and a second step compensating member 602 of the step compensating members 601 and 602 may be disposed between the lower cover panel 100 and the second support plate 502 in the folding region FR. The step compensating members 601 and 602 may be disposed to be spaced apart from each other.

The step compensating members 601 and 602 serve to fill separation spaces between the lower cover panel 100 and the support plates 501 and 502 in the folding region FR to compensate for a step due to the first and second plate coupling films 931 and 932.

In FIG. 2, for convenience of illustration, the panels and/or members on upper side of the support plates 501 and 502 are schematically illustrated to be flat without any surface step due to the support plates 501 and 502. However, as illustrated in FIG. 3, in an embodiment of the display device 1 which is foldable and in which the support plates 501 and 502 are disposed at the bottom surface of the display device 1 during usage, the panels and/or members may include convex surface steps protruding downward due to gravity by reflecting lower steps, caused by the lower structure (the support plates 501 and 502), the first and second plate coupling films 931 and 932, and the step compensating members 601 and 602.

Referring to FIGS. 3 and 4, the step compensating members 601 and 602 include a plurality of stacked films. The first step compensating member 601 may include a first step compensating coupling film 611, a first step compensating substrate 631, and a first light shielding layer 651. The second step compensating member 602 may include a second step compensating coupling film 612, a second step compensating substrate 632, and a second light shielding layer 652.

The first step compensating coupling film 611, the first step compensating substrate 631 and the first light shielding layer 651 may respectively have first inner side surfaces 611S1, 631S1 and 651S1, which face the inner side surface 931S of the first plate coupling film 931, and may respectively have second inner side surfaces 611S2, 631S2 and 651S2, which face the first inner side surfaces 611S1, 631S1 and 651S1.

The second step compensating coupling film 612, the second step compensating substrate 632 and the second light shielding layer 652 may respectively have first inner side surfaces 612S1, 632S1 and 652S1, which face the inner side surface 932S of the second plate coupling film 932, and may respectively have second inner side surfaces 612S2, 632S2 and 652S2, which face the first inner side surfaces 612S1, 632S1 and 652S1.

Although the first inner side surfaces 611S1, 631S1 and 651S1 of the configurations (or elements) 611, 631 and 651 of the first step compensating member 601 are illustrated as being aligned to each other in a thickness direction in FIG. 3 for convenience of illustration, embodiments are not limited thereto. In an embodiment, due to some process variations, the first inner side surfaces 611S1, 631S1 and 651S1 may not be aligned in the thickness direction, and some of the inner side surfaces may protrude outward or be indented inward. In such an embodiment, the second inner side surfaces 611S2, 631S2 and 651S2 may be aligned to each other in the thickness direction, but embodiments are not limited thereto. Alternatively, and some of the inner side surfaces may protrude outward or be indented inward. The configurations 612, 632 and 652 of the second step compensating member 602 may be substantially the same as those of the first step compensating member 601, and any repetitive detailed description thereof will be omitted.

In an embodiment, as illustrated in FIG. 4, each of the step compensating members 601 and 602 may have a linear shape extending in the extending direction of the folding axis AXIS_F (the second direction DR2). The step compensating members 601 and 602 may extend between both long side edges LS1 and LS2 (see FIG. 1) from one to the other of the long side edges LS1 and LS2, but embodiments are not limited thereto. The step compensating members 601 and 602 may extend only to an extent to allow a step compensating function to be smoothly performed by sufficiently filling separation spaces between the lower cover panel 100 and the support plates 501 and 502 in the folding region FR and may not extend to the both long side edges LS1 and LS2 of the display device 1.

The first and second step compensating coupling films 611 and 612 of the step compensating members 601 and 602 may be disposed on upper surfaces of the support plates 501 and 502, respectively. In such an embodiment, in the folding region FR, the first step compensating coupling film 611 and the second step compensating coupling film 612 serve to couple the support plates 501 and 502 to the configurations 631 and 632 disposed thereon. The first step compensating coupling film 611 and the second step compensating coupling film 612 may be disposed to be spaced apart from each other with the separation space between the support plates 501 and 502 disposed therebetween.

The first and second step compensating coupling films 611 and 612 may include at least one selected from the materials described above for the above-described first and second plate coupling films 931 and 932. In an embodiment, each of the first and second step compensating coupling films 611 and 612 may include the PSA.

Elastic moduli of the first and second step compensating coupling films 611 and 612 may be greater than elastic moduli of the first and second plate coupling films 931 and 932. In one embodiment, for example, the elastic moduli of the first and second plate coupling films 931 and 932 may be about 0.04 megapascal (MPa) to about 0.06 MPa or about 0.03 MPa to about 0.06 MPa at room temperature (about 23° C. to about 25° C.). In an embodiment, the elastic moduli of the first and second step compensating coupling films 611 and 612 may be greater than about 0.06 MPa. As will be described below, when the display device 1 is folded, a degree of stress applied to the first and second step compensating coupling films 611 and 612 is lower than stress applied to the first and second plate coupling films 931 and 932, even when the first and second step compensating coupling films 611 and 612 have large elastic moduli, damages to the first and second step compensating coupling films 611 and 612 are negligible. Generally, the process cost increases as elastic moduli of coupling films is smaller. In an embodiment, by making the elastic moduli of the coupling films used as the first and second step compensating coupling films 611 and 612 to be greater than the elastic moduli of the coupling films used as the first and second plate coupling films 931 and 932 as described above, the overall process cost may be reduced.

In an alternative embodiment, the elastic moduli of the first and second step compensating coupling films 611 and 612 may substantially be the same as the elastic moduli of the first and second plate coupling films 931 and 932. In such an embodiment, stress applied to the folding region FR may be further mitigated when the display device 1 is folded.

The step compensating substrates 631 and 632 may be disposed on the first and second step compensating coupling films 611 and 612, respectively. In an embodiment, in the folding region FR, the first step compensating substrate 631 may be disposed between the first step compensating coupling film 611 and the lower cover panel 100, and the second step compensating substrate 632 may be disposed between the second step compensating coupling film 612 and the lower cover panel 100.

In an embodiment, the step compensating substrates 631 and 632 may include at least one of materials generally used as substrates. In one embodiment, for example, the step compensating substrates 631 and 632 may include at least one of TPU, PET, PI, PC, PE, polypropylene ("PP"), polysulfone ("PSF"), PMMA, triacetyl cellulose ("TAC"), and cyclo olefin polymer ("COP"), but embodiments are not limited thereto.

The light shielding layers 651 and 652 may be disposed on the step compensating substrates 631 and 632. In an embodiment, in the folding region FR, the first light shielding layer 651 may be disposed between the first step compensating substrate 631 and the lower cover panel 100, and the second light shielding layer 652 may be disposed between the second step compensating substrate 632 and the lower cover panel 100.

The light shielding layers 651 and 652 may be disposed directly on upper surfaces of the step compensating substrates 631 and 632. The light shielding layers 651 and 652 serve to prevent transmission of light to effectively prevent patterns due to steps between the first and second plate coupling films 931 and 932 and the step compensating members 601 and 602 and patterns due to a step between the first support plate 501 and the second support plate 502 from being visible from a top side.

The light shielding layers 651 and 652 may include a light absorbing material such as a black pigment or a black dye. The light shielding layers 651 and 652 may include a black ink. The light shielding layers 651 and 652 may be formed by coating or printing the black ink on upper surfaces of the step compensating substrates 631 and 632. In such an embodiment where the light shielding layers 651 and 652 include a black ink, the step compensating members 601 and 602 may be black one-sided tapes.

Each of the first and second plate coupling films 931 and 932 have a first thickness t1. The first thickness t1 may be in a range of about 16 μm to about 25 μm. The first thickness t1 of the first plate coupling film 931 and the first thickness t1 of the second plate coupling film 932 may be substantially the same as each other.

The step compensating members 601 and 602 have a second thickness t2. The second thickness t2 of the step compensating members 601 and 602 is equal to the sum of thicknesses of the step compensating coupling films 611 and 612, the step compensating substrates 631 and 632, and the light shielding layers 651 and 652. In an embodiment, the second thickness t2 of the step compensating members 601 and 602 may be substantially the same as the first thickness t1 of the first and second plate coupling films 931 and 932 to fill the separation spaces between the lower cover panel 100 and the support plates 501 and 502 in a region exposed by the first and second plate coupling films 931 and 932. Accordingly, the second thickness t2 may be in a range of about 16 μm to about 25 μm. In one embodiment, a third thickness t3 of the first and second step compensating coupling films 611 and 612 may be in a range of about 3 μm to about 10 μm, a fourth thickness t4 of the first and second step compensating substrates 631 and 632 may be in a range of about 10 μm to about 20 μm, and a fifth thickness t5 of the first and second light shielding layers 651 and 652 may be in a range of about 2 μm to about 6 μm.

However, the range of the second thickness t2 of the step compensating members 601 and 602 is not limited to the above-mentioned thickness range. In an alternative embodiment, even when the second thickness t2 of the step compensating members 601 and 602 is less than the first thickness t1 of the first and second plate coupling films 931 and 932, e.g., when the difference between the second thickness t2 and the first thickness t1 is in a range of about 3 μm to about 5 μm, the step compensating members 601 and 602 may effectively perform the step compensating function.

In an embodiment, as illustrated in FIG. 3, the step compensating members 601 and 602 may be disposed between the inner side surfaces 931S and 932S of the first and second plate coupling films 931 and 932 and inner side surfaces 501S and 502S of the first and second support plates 501 and 502. In such an embodiment, a first inner side surface 601S1 of the first step compensating member 601 may face the inner side surface 931S of the first plate coupling film 931 and be spaced apart therefrom with a predetermined separation distance, and a second inner side surface 601S2 may be disposed more inward than the inner side surface 501S of the first support plate 501. In such an embodiment, a first inner side surface 602S1 of the second step compensating member 602 may face the inner side surface 932S of the second plate coupling film 932 and be spaced apart therefrom with a predetermined separation distance, and a second inner side surface 602S2 may be disposed more inward than the inner side surface 502S of the second support plate 502.

In the plan view, the second inner side surface 601S2 of the first step compensating member 601 and the inner side surface 501S of the first support plate 501 are spaced apart from each other with a second separation distance d2. The second separation distance d2 may be in a range of about 90 μm to about 110 μm, but embodiments are not limited thereto. In one embodiment, for example, the second separation distance d2 may be about 100 μm.

In the plan view, the second inner side surface 602S2 of the second step compensating member 602 and the inner side surface 502S of the second support plate 502 are spaced apart from each other with a third separation distance d3, and the range of the separation distance d3 may substantially be the same as the above-mentioned range of the second separation distance d2.

In an embodiment, the second inner side surfaces 601S2 and 602S2 of the step compensating members 601 and 602 and the inner side surfaces 501S and 502S of the support plates 501 and 502 are spaced apart at such separation distances to secure a sufficient margin of space in which the step compensating members 601 and 602 are disposed in the process in which the step compensating members 601 and 602 are disposed on the upper surfaces of the support plates 501 and 502.

In such an embodiment, since the second inner side surfaces 601S2 and 602S2 of the step compensating members 601 and 602 are disposed more inward than the inner side surfaces 501S and 502S of the support plates 501 and 502, respectively, a coupling material of the first and second step compensating coupling films 611 and 612 may be effectively prevented from flowing out to the inner side surfaces 501S and 502S of the support plates 501 and 502.

The first plate coupling film 931 and the first step compensating member 601 may be spaced apart from each other with a fourth separation distance d4, and the second plate coupling film 932 and the second step compensating member 602 may be spaced apart from each other with a fifth separation distance d5. The fourth and fifth separation distances d4 and d5 may be adjusted in consideration of visibility elimination and folding defect of a step space between the first and second plate coupling films 931 and 932 and the step compensating members 601 and 602.

in an embodiment, the separation distances d4 and d5 between the first and second plate coupling films 931 and 932 and the step compensating members 601 and 602 may be about 800 μm or less to effectively reduce or eliminate visibility of the step space between the first and second plate coupling films 931 and 932 and the step compensating members 601 and 602 from the outside.

In an embodiment, stress is applied to the first and second plate coupling films 931 and 932 in a process in which folding and unfolding of the display device 1 are repeated, and some of the materials constituting the first and second plate coupling films 931 and 932 may flow toward inner sides of the inner side surfaces 931S and 932S of the first and second plate coupling films 931 and 932 due to such stress. If some of the materials constituting the first and second plate coupling films 931 and 932 are coupled to portions of the step compensating members 601 and 602 and interfere with separation between the lower cover panel 100 and the step compensating members 601 and 602 when the display device 1 is folded, thereby causing a folding defect. In an embodiment, the separation distances d4 and d5 between the first and second plate coupling films 931 and 932 and the step compensating members 601 and 602 may be determined in a way to prevent coupling between the first and second plate coupling films 931 and 932 and the step compensating members 601 and 602. When the separation distances d4 and d5 between the first and second plate coupling films 931 and 932 and the step compensating members 601 and 602 are about 300 μm or greater, the probability of occurrence of such coupling may be significantly reduced. Accordingly, in an embodiment, each of the fourth and fifth separation distances d4 and d5 may be in a range of about 300 μm to 800 μm.

In an embodiment, during operation of unfolding the display device 1, the first and second step compensating coupling films 611 and 612 may couple the step compensating substrates 631 and 632 to the support plates 501 and 502 therebelow, the first and second light shielding layers 651 and 652 may be directly formed on the upper surfaces of the step compensating substrates 631 and 632, and the step compensating members 601 and 602 may be coupled to the support plates 501 and 502 therebelow. In such an embodiment, since the first and second light shielding layers 651 and 652 come in contact with the lower cover panel 100 thereabove but may not be completely attached to the lower cover panel 100, the step compensating members 601 and 602 may come in contact with the lower cover panel 100 thereabove but may not be completely attached thereto.

In such an embodiment, even when each of the first and second light shielding layers 651 and 652 is partially coupled to the lower cover panel 100 thereabove (the step compensating members 601 and 602 are partially coupled to the lower cover panel 100), coupling forces therebetween may be smaller than coupling forces between the step compensating members 601 and 602 and the support plates 501 and 502. That is, a first coupling force between the first step compensating member 601 and the first support plate 501 may be greater than a second coupling force between the first step compensating member 601 and the lower cover panel 100, and a third coupling force between the second step compensating member 602 and the second support plate 502 may be greater than a fourth coupling force between the second step compensating member 602 and the lower cover panel 100.

Due to the above-described differences between the coupling forces of the configurations, during operation of folding the display device 1, the display device 1 may be folded in a state in which the step compensating members 601 and 602 are attached to upper portions of the support plates 501 and 502 and detached from the lower cover panel 100.

Referring to FIGS. 5 and 6, although the display module 10 is folded with a predetermined curvature due to an external force in the folding region FR, the display module 10 may not be substantially folded due to an external force in the non-folding regions NFR1 and NFR2. In an embodiment, as shown in FIG. 5, a plane in which the first non-folding region NFR1 is disposed and a plane in which the second non-folding region NFR2 is disposed may be parallel to each other, but alternatively, such planes may be disposed to form a predetermined acute angle with each other.

When an external force is applied to one side (around the second non-folding region NFR2) of the display device 1 in a folding direction (the third direction DR3 in FIG. 1), the folding region FR is bent or folded, and the second non-folding region NFR2 may overlap or face the first non-folding region NFR1 by moving or rotating in the folding direction.

In a case where the support plates 501 and 502 are formed of the above-mentioned rigid material, high bending stress may occur when the rigid support plates 501 and 502 are folded. In such case, the bending stress may be transmitted to the display module 10 above the support plates 501 and 502 and become a cause of a defect.

Thus, in an embodiment of the invention, the support plates 501 and 502 and the display module 10 may not be adhered to each other in the folding region FR. In an embodiment, in the folding region FR of the support plates 501 and 502, the first and second plate coupling films 931 and 932 are not disposed, and the step compensating members 601 and 602, which are coupled and fixed to the support plates 501 and 502 when the display device 1 is folded, are disposed. Therefore, direct coupling between the support plates 501 and 502 and the display module 10 does not occur in the folding region FR.

In an embodiment, as described above, since the coupling force between the step compensating members 601 and 602 and the lower cover panel 100 is smaller than the coupling force between the step compensating members 601 and 602 and the support plates 501 and 502, in the state in which the display device 1 is folded, the step compensating members 601 and 602 are still coupled to the support plates 501 and 502 but are separated from the lower cover panel 100 thereabove as illustrated in FIGS. 5 and 6.

In such an embodiment, during the operation of folding the display device 1, the first and second step compensating coupling films 611 and 612, the step compensating substrates 631 and 632, and the light shielding layers 651 and 652 are respectively coupled to the support plates 501 and 502 but are separated from the lower cover panel 100.

Accordingly, in such an embodiment, the support plates 501 and 502 are effectively prevented from being bent together with the display module 10 when the display device 1 is bent, thereby preventing a defect of the display module 10 due to the bending stress.

Figure 7:
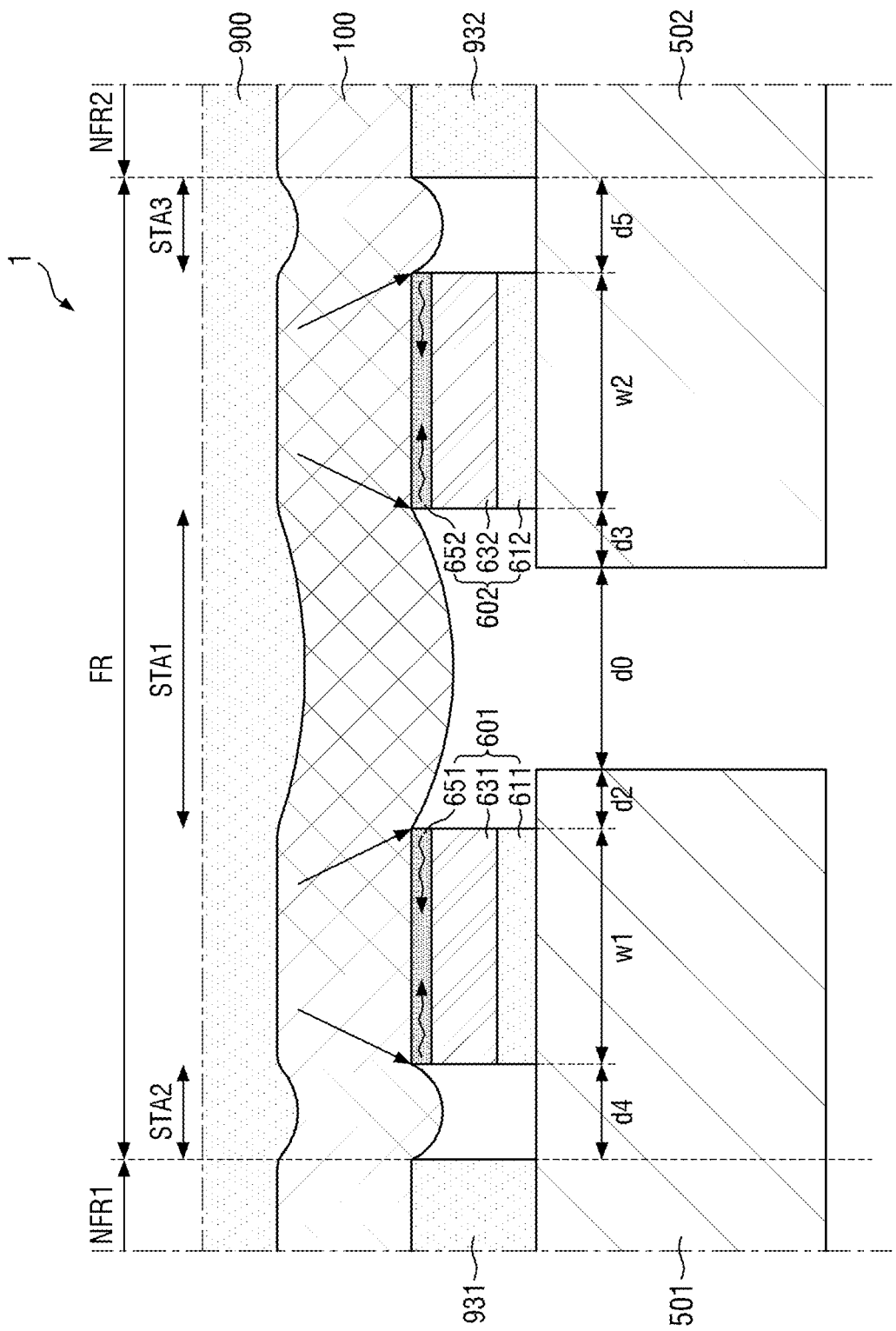
FIG. 7 is a cross-sectional view for describing a step compensating function and pattern visibility elimination of the display device according to an embodiment.
Figure 8:
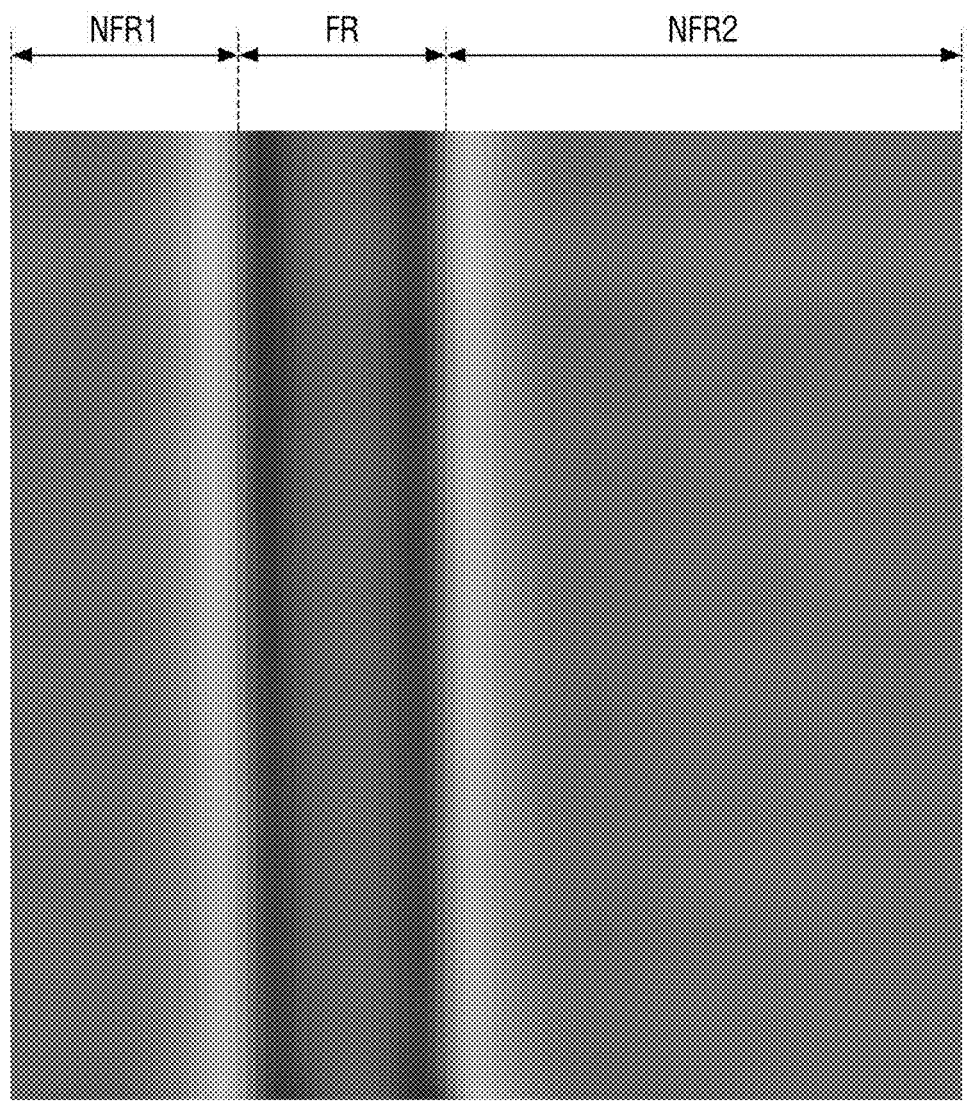
FIG. 8 is a photograph of a plane of the display device in which a step compensating member is omitted.
Figure 9:
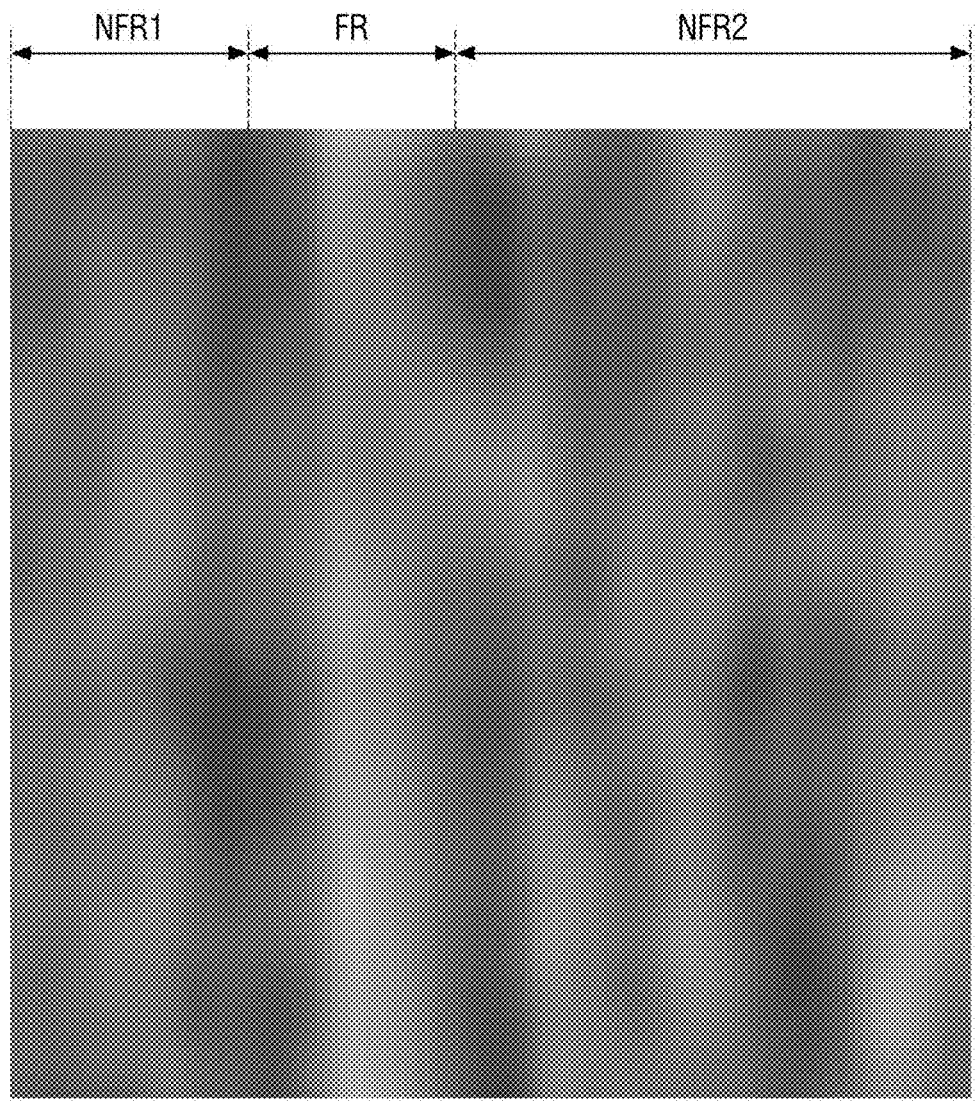
FIG. 9 is a photograph of a plane of the display device including the step compensating member.

FIG. 7 is a cross-sectional view for describing a step compensating function and pattern visibility elimination of the display device according to an embodiment, FIG. 8 is a photograph of a plane of the display device in which a step compensating member is omitted, and FIG. 9 is a photograph of a plane of the display device including the step compensating member. Specifically, FIG. 7 illustrates the unfolded state of the display device 1 in which the support plates 501 and 502 of the display device 1 are disposed at the bottom surface of the display device 1.

Referring to FIG. 7, the folding region FR of the display device 1 includes a step section. The display device 1 includes the step section in the separation space between the first and second plate coupling films 931 and 932, that is, the folding region FR. In such a step section, a surface step in which the panels and members at the upper side are visible as patterns from the outside as described above may be generated. Also, even when the lower cover panel 100 has a low light transmittance and shields light projected downward from the display area DA of the display panel 200 as described above, when a portion of the light leaks through the lower cover panel 100 and is incident on the step section, the step section may be directly visible as patterns from the outside due to the light incident thereon.

In an embodiment, the step compensating members 601 and 602 having substantially the same thickness as the first and second plate coupling films 931 and 932 are disposed in the step section to reduce such pattern visibility. The step compensating members 601 and 602 may substantially reduce a width of the above-described step section.

In such an embodiment, since the step compensating members 601 and 602 are disposed at the upper portions of the support plates 501 and 502 exposed by the first and second plate coupling films 931 and 932, the overall width of the step section of the display device 1 is reduced, and only first to third step sections STA1, STA2 and STA3 remain.

In such an embodiment, as illustrated in FIG. 7, the first step section STA1 is a separation space between the step compensating members 601 and 602 and may have a width that is equal to the sum of the separation distance d0 between the support plates 501 and 502 and the second and third separation distances d2 and d3. In an embodiment, where the separation distance d0 between the support plates 501 and 502 and the second and third separation distances d2 and d3 are in the ranged described above, the width of the first step section STA1 may be in a range of about 0.2 mm to 0.4 mm. In one embodiment, for example, the width of the first step section STA1 may be about 0.3 mm.

The second and third step sections STA2 and STA3 may have widths corresponding to the fourth and fifth separation distances d4 and d5, respectively. Accordingly, in an embodiment, the widths of the second and third step sections STA2 and STA3 may be in a range of about 0.2 mm to 0.4 mm. In one embodiment, for example, the widths of the second and third step sections STA2 and STA3 may be about 0.3 mm.

Each of the step compensating members 601 and 602 has a predetermined width. When such a width is significantly greater than the widths of the step sections STA1, STA2, and STA3, the possibility of pattern visibility due to the surface steps of the upper configurations 100, 200, 300, 900, 910, and 920 generated by the first to third step sections STA1, STA2, and STA3 is reduced.

In an embodiment, the first step compensating member 601 has a first width w1, and the second step compensating member 602 has a second width w2. The first width w1 and the second width w2 may be widths that are substantially the same or similar to each other. The widths w1 and w2 of the step compensating members 601 and 602 may be, for example, in a range of about 3.0 mm to about 3.3 mm. In some embodiments, the widths w1 and w2 of the step compensating members 601 and 602 may be about 3.2 mm. In an embodiment, the widths w1 and w2 of the step compensating members 601 and 602 may be about 8 to 12 times greater than the width of each of the first to third step sections STA1, STA2, and STA3.

In an embodiment, as described above, the first to third step sections STA1, STA2 and STA3 are still generated even when the step compensating members 601 and 602 are disposed. In such an embodiment, the widths of the first to third step sections STA1, STA2 and STA3 are significantly smaller than the widths w1 and w2 of the step compensating members 601 and 602, such that the surface step generated in the configurations 100, 200, 300, 900, 910, and 920 disposed at the upper side of the first and second plate coupling films 931 and 932 and the step compensating members 601 and 602 may be minimal or negligible, and thus the first to third step sections STA1, STA2 and STA3 may not be recognized as patterns from the outside. Accordingly, in such an embodiment, the step sections may be effectively prevented from being directly visible or recognized as patterns by a viewer from an outside.

Referring to FIG. 8, in a case in which the step compensating members 601 and 602 are not disposed, step sections in the separation space (the folding region FR) between the first and second plate coupling films 931 and 932 may be visible as patterns from the outside.

In an embodiment of the invention, as shown in FIG. 9, the step compensating members 601 and 602 having a width determined for eliminating pattern visibility are provided in the folding region FR, such that the step sections in the folding region FR may be effectively prevented from being visible as patterns, or the pattern visibility may at least be reduced.

Referring back to FIG. 7, in an embodiment, the light shielding layers 651 and 652 including a light absorbing material may effectively prevent light, which is incident from the outside, from advancing to the first to third step sections STA1, STA2 and STA3, and the possibility that the step sections themselves are visible as patterns due to light leaked through the lower portion of the lower cover panel 100 may be further reduced.

When the light shielding layers 651 and 652 are at a higher position than a surface of each of the support plates 501 and 502 facing the lower cover panel 100, the greater the height difference between the light shielding layers 651 and 652 and the surface of each of the support plates 501 and 502 is, the better the shielding of light advancing to each of the step sections STA1, STA2, and STA3 by the light shielding layers 651 and 652 is. In an embodiment, since the light shielding layers 651 and 652 are disposed at the uppermost surfaces of the step compensating members 601 and 602, an amount of light incident on adjacent step sections STA1, STA2, and STA3 is reduced, thereby reducing the possibility that the step sections are recognized as patterns.

Hereinafter, alternative embodiments will be described. Hereinafter, the like or same elements or configurations of such alternative embodiments as those of the above-described embodiment will be denoted by the same reference numerals, and any repetitive detailed description thereof will be omitted or simplified.

Figure 10:
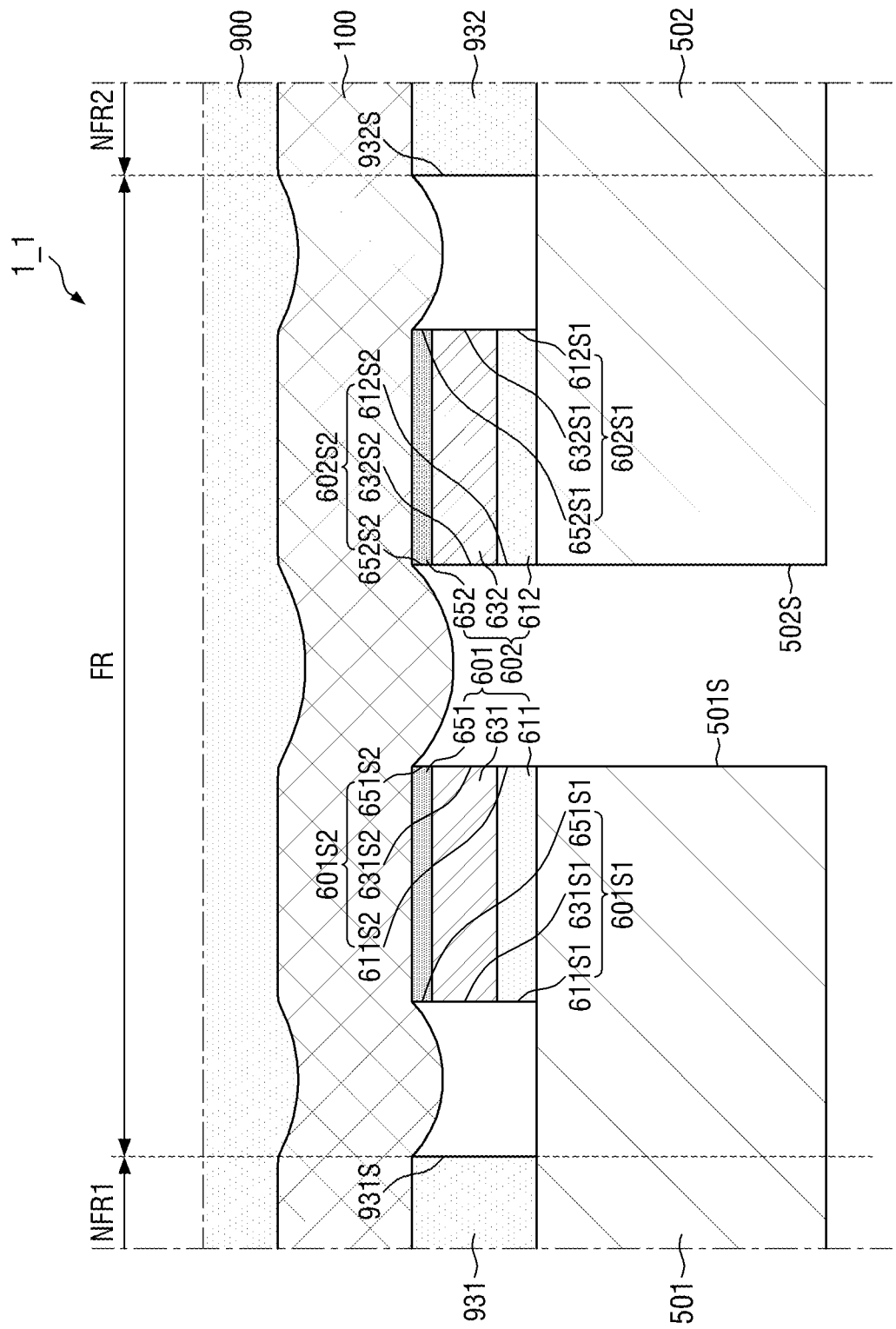
FIG. 10 is a cross-sectional view of a display device according to an alternative embodiment.

FIG. 10 is a cross-sectional view of a display device according to an alternative embodiment.

An embodiment of the display device 1_1 shown in FIG. 10 is different from the embodiments of the display device 1 described above with reference to FIGS. 1 to 3 in that second inner side surfaces 601S2 and 602S2 of step compensating members 601 and 602 are respectively aligned with inner side surfaces 501S and 502S of support plates 501 and 502 in a thickness direction.

In an embodiment, as shown in FIG. 10, the second inner side surfaces 601S2 and 602S2 of the step compensating members 601 and 602 may be respectively aligned with the inner side surfaces 501S and 502S of the support plates 501 and 502 in the thickness direction, and the second inner side surfaces 601S2 and 602S2 of the step compensating members 601 and 602 may be disposed to be spaced apart from each other at an interval equal to a separation distance between the inner side surfaces 501S and 502S of the support plates 501 and 502.

Figure 11:
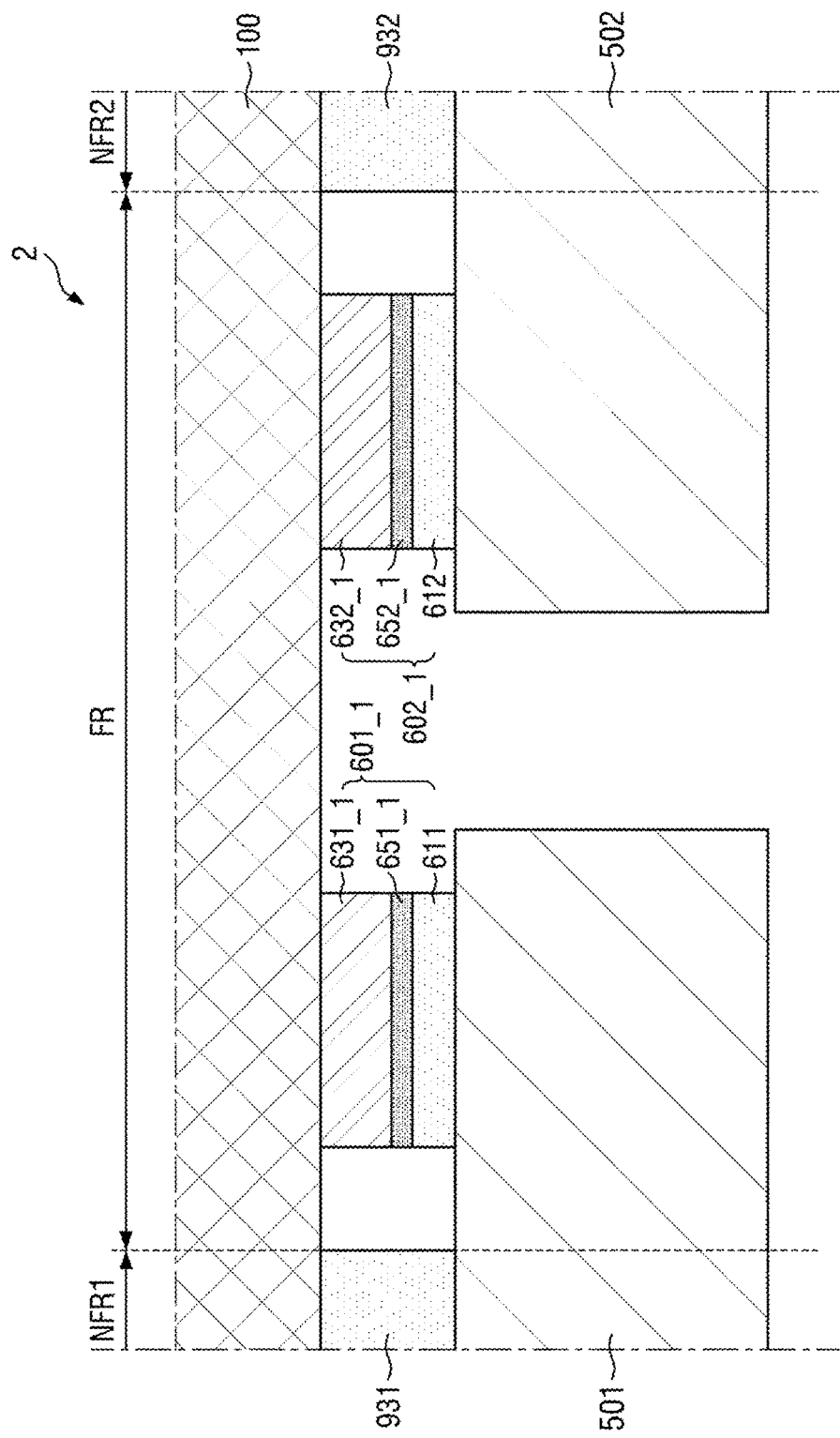
FIG. 11 is a view illustrating a lower surface (or a back surface) of a display module of a display device according to another alternative embodiment.

FIG. 11 is a view illustrating a lower surface (or a back surface) of a display module of a display device according to another alternative embodiment. In FIGS. 11 to 34, for convenience of illustration, panels and/or members on upper side of support plates 501 and 502 are simply illustrated to be flat without any surface step due to the support plates 501 and 502, but it would be understood that the panels and/or members may not be flat according to a usage environment of the above-described display device.

Referring to FIG. 11, in such an embodiment of a display device 2, step compensating members 601_1 and 602_1 are different from the step compensating members 601 and 602 described above with reference to FIG. 3 in that light shielding layers 651_1 and 652_1 of the step compensating members 601_1 and 602_1 are disposed between first and second step compensating coupling films 611 and 612 and step compensating substrates 631_1 and 632_1.

In such an embodiment, as shown in FIG. 11, a first light shielding layer 651_1 may be disposed between the first step compensating coupling film 611 and a first step compensating substrate 631_1, and attached to a first support plate 501 by the first step compensating coupling film 611. In such an embodiment, a second light shielding layer 652_1 may be disposed between the second step compensating coupling film 612 and a second step compensating substrate 632_1, and attached to a second support plate 502 by the second step compensating coupling film 612. In such an embodiment, the first step compensating substrate 631_1 may be disposed between the first light shielding layer 651_1 and a lower cover panel 100, and the second step compensating substrate 632_1 may be disposed between the second light shielding layer 652_1 and the lower cover panel 100.

The light shielding layers 651_1 and 652_1 may be directly provided or formed on surfaces of the step compensating substrates 631_1 and 632_1 facing the support plates 501 and 502 such that a coupling force between the step compensating substrates 631_1 and 632_1 and the light shielding layers 651_1 and 652_1 is greater than a coupling force between the step compensating substrates 631_1 and 632_1 and the lower cover panel 100. However, embodiments are not limited thereto, and alternatively, the light shielding layers 651_1 and 652_1 may be directly provided or formed on surfaces of the first and second step compensating coupling films 611 and 612 facing the lower cover panel 100. In such an embodiment, surface-treating surfaces of the step compensating substrates 631_1 and 632_1 may be determined in a way to allow the step compensating members 601_1 and 602_1 to be fixed to the support plates 501 and 502 when the display device 2 is folded. In an embodiment, surface-treating surfaces of the step compensating substrates 631_1 and 632_1 may be determined in a way such that the surfaces at upper and lower portions have different attachment properties to allow the coupling force between the step compensating substrates 631_1 and 632_1 and the light shielding layers 651_1 and 652_1 to be greater than the coupling force between the step compensating substrates 631_1 and 632_1 and the lower cover panel 100.

Figure 12:
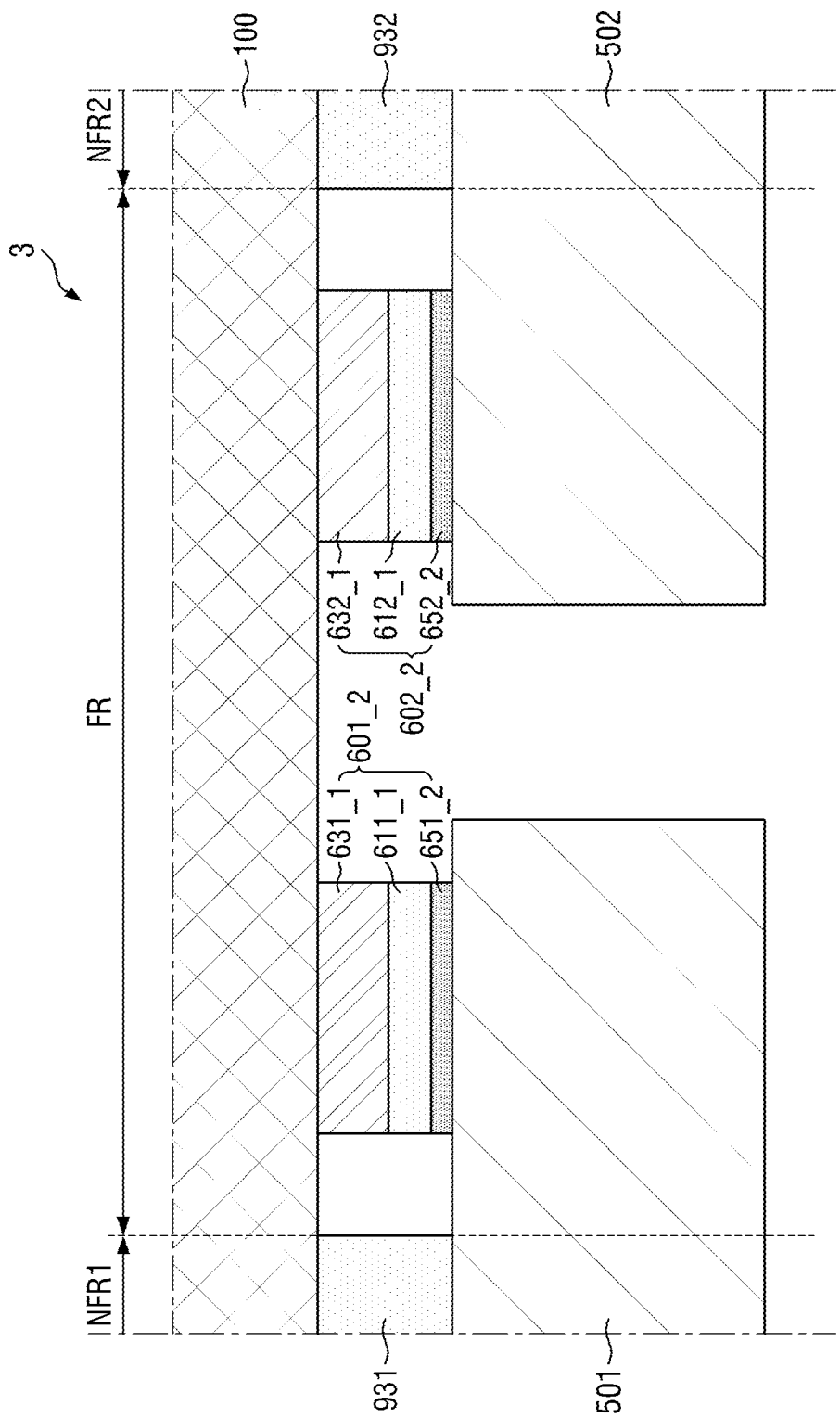
FIG. 12 is a view illustrating a lower surface (or a back surface) of a display module of a display device according to still another alternative embodiment.

FIG. 12 is a view illustrating a lower surface (or a back surface) of a display module of a display device according to yet another alternative embodiment.

Referring to FIG. 12, in such an embodiment of a display device 3, step compensating members 601_2 and 602_2 are different from the step compensating members 601 and 602 in FIG. 3 in that light shielding layers 651_2 and 652_2 of the step compensating members 601_2 and 602_2 are disposed between support plates 501 and 502 and first and second step compensating coupling films 611_1 and 612_1.

In such an embodiment, a first light shielding layer 651_2 may be disposed between a first support plate 501 and the first step compensating coupling film 611_1, and a second light shielding layer 652_2 may be disposed between a second support plate 502 and the second step compensating coupling film 612_1. In such an embodiment, the first step compensating coupling film 611_1 may be disposed between the first light shielding layer 651_2 and the first step compensating substrate 631_1 to couple the first light shielding layer 651_2 and the first step compensating substrate 631_1 to each other, and the second step compensating coupling film 612_1 may be disposed between the second light shielding layer 652_2 and the second step compensating substrate 632_1 to couple the second light shielding layer 652_2 and the second step compensating substrate 632_1 to each other. In such an embodiment, a first step compensating substrate 631_1 may be disposed between the first step compensating coupling film 611_1 and a lower cover panel 100, and a second step compensating substrate 632_1 may be disposed between the second step compensating coupling film 612_1 and the lower cover panel 100.

The light shielding layers 651_2 and 652_2 may be directly provided or formed on surfaces of the support plates 501 and 502 facing the lower cover panel 100, but embodiments are not limited thereto. Alternatively, the light shielding layers 651_2 and 652_2 may be directly provided or formed on surfaces of the first and second step compensating coupling films 611_1 and 612_1 facing the support plates 501 and 502.

In such an embodiment, where the light shielding layers 651_2 and 652_2 are directly formed on surfaces of the first and second step compensating coupling films 611_1 and 612_1 facing the support plates 501 and 502, the light shielding layers 651_2 and 652_2 may be firmly attached to surfaces of the support plates 501 and 502 by determining surface-treating or the like of the surfaces in a way to allow the step compensating members 601_2 and 602_2 to be attached to the support plates 501 and 502 and to be separated from the lower cover panel 100 when the display device 3 is folded.

Figure 13:
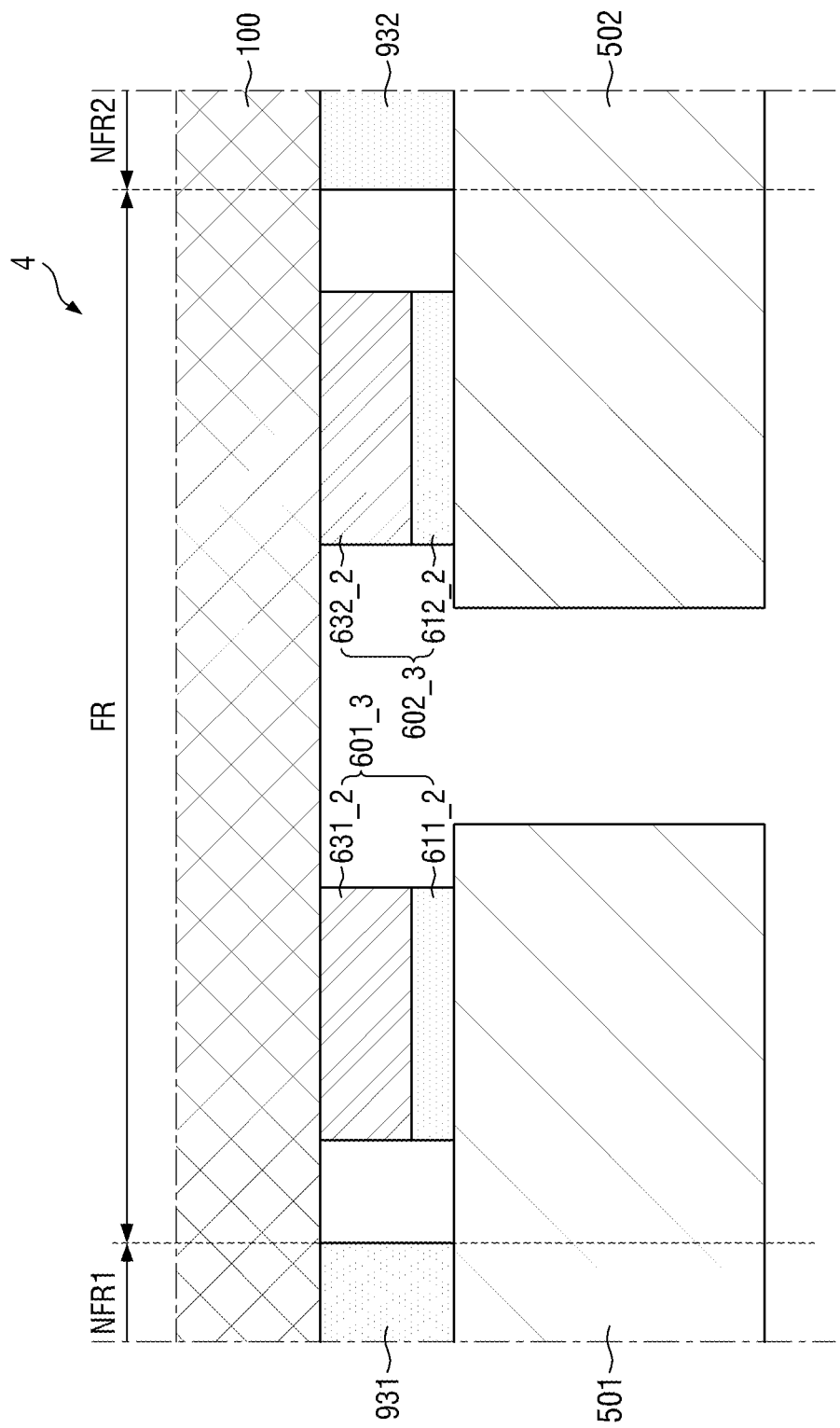
FIG. 13 is a view illustrating a lower surface (or a back surface) of a display module of a display device according to yet another alternative embodiment.

FIG. 13 is a view illustrating a lower surface (or a back surface) of a display module of a display device according to yet another alternative embodiment.

Referring to FIG. 13, in such an embodiment of a display device 4, step compensating members 601_3 and 602_3 are different from the step compensating members 601 and 602 described above with reference to FIG. 3 in that first and second step compensating coupling films 611_2 and 612_2 of the step compensating members 601_3 and 602_3 include a material constituting a light shielding layer.

In such an embodiment, as shown in FIG. 13, the first and second step compensating coupling films 611_2 and 612_2 may be respectively disposed between step compensating substrates 631_2 and 632_2 and support plates 501 and 502 and formed of the material constituting the light shielding layer. The material constituting the light shielding layer may be at least one of the above-mentioned light absorbing materials.

In embodiments of the invention, as described above with reference to FIGS. 11 to 13, the stacked structure of the configurations may be modified in various ways, while the configurations (e.g., coupling films, step compensating substrates or light absorbing material) of such embodiments are the same as those of the embodiments of the display device 1 and 1_1 described above with reference to FIGS. 1 to 10.

Figure 14:
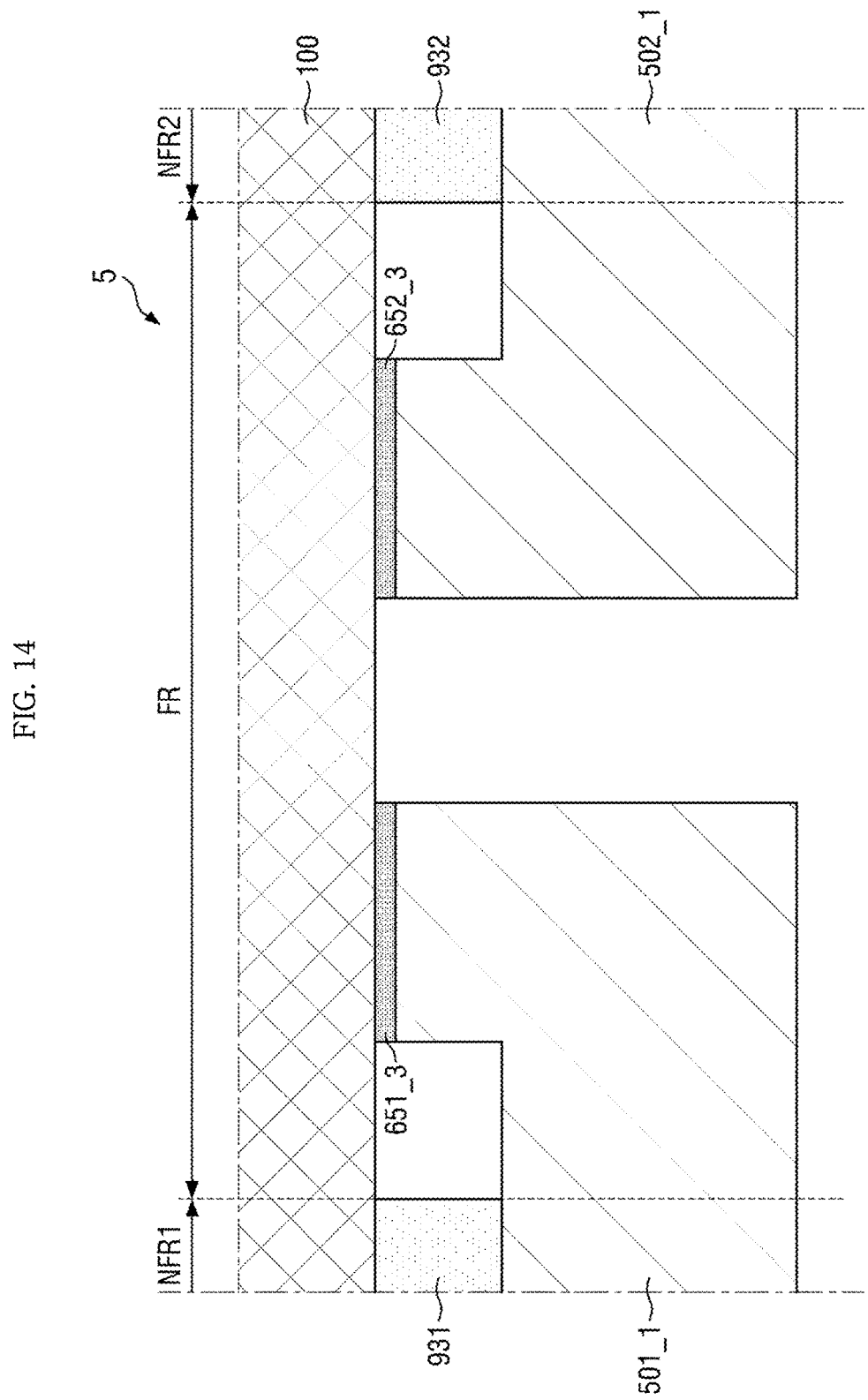
FIG. 14 is a view illustrating a lower surface (or a back surface) of a display module of a display device according to yet another alternative embodiment.

FIG. 14 is a view illustrating a lower surface (or a back surface) of a display module of a display device according to yet another alternative embodiment.

An embodiment of the display device 5 shown in FIG. 14 is different from the embodiments of the display device 1 described above in that end portions of support plates 501_1 and 502_1 protrude in a direction facing a lower cover panel 100 and perform the step compensating function together with light shielding layers 651_3 and 652_3.

In such an embodiment, as shown in FIG. 14, the support plates 501_1 and 502_1 further include protrusions protruding in the direction facing the lower cover panel 100. The sum of a thickness of each protrusion of the support plates 501_1 and 502_1 and a thickness of each of the light shielding layers 651_3 and 652_3 disposed thereon may be substantially the same as the thickness of each of first and second plate coupling films 931 and 932.

In such an embodiment, where the protrusions of the support plates 501_1 and 502_1 substantially perform the step compensating function, the tolerance in consideration of an alignment error of the step compensating members may not be considered, and the overall width of step sections in the folding region FR may be reduced. Such support plates 501_1 and 502_1 may be manufactured using an injection molding method.

Figure 15:
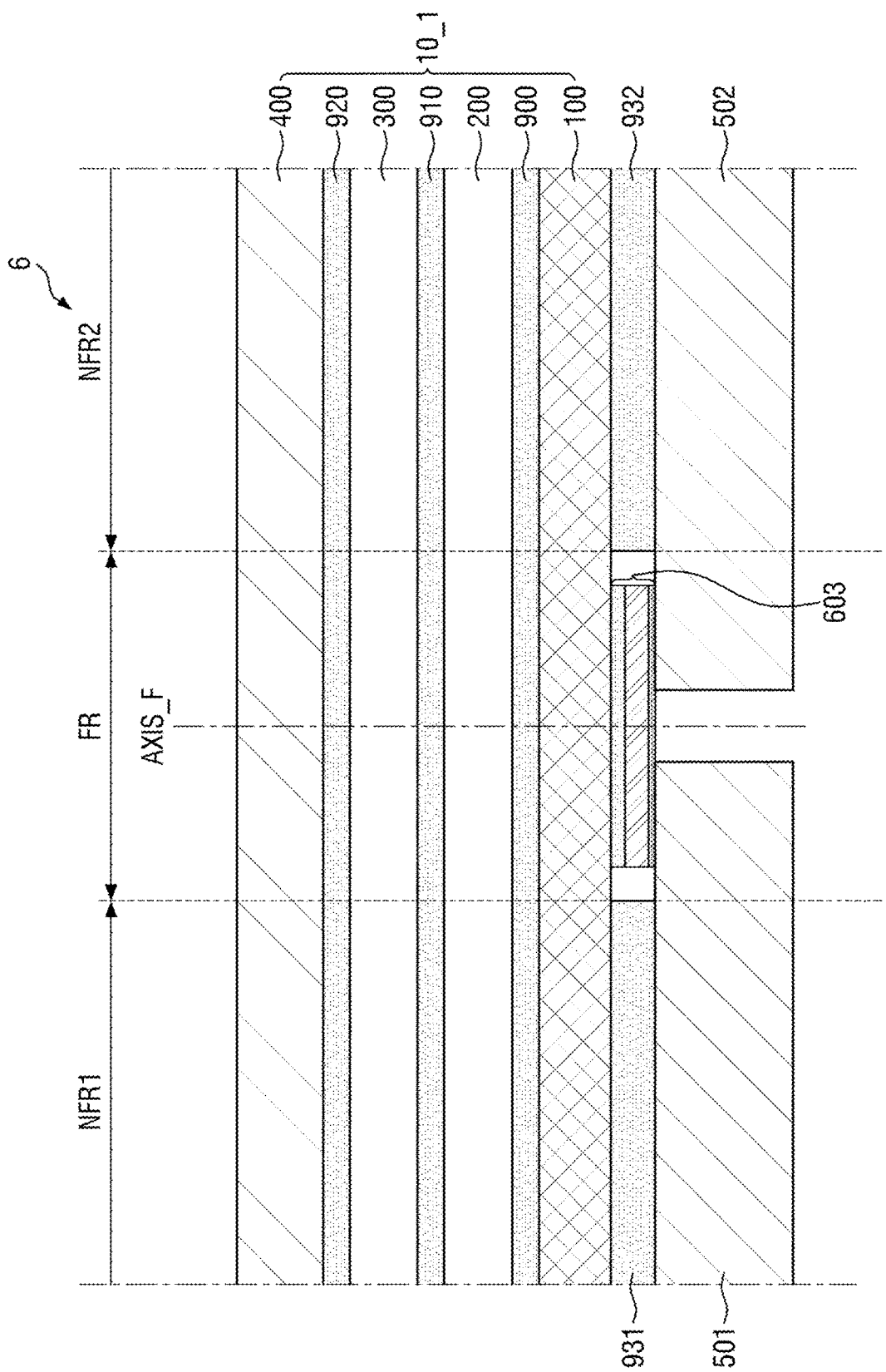
FIG. 15 is a cross-sectional view of a display device according to an alternative embodiment.
Figure 16:
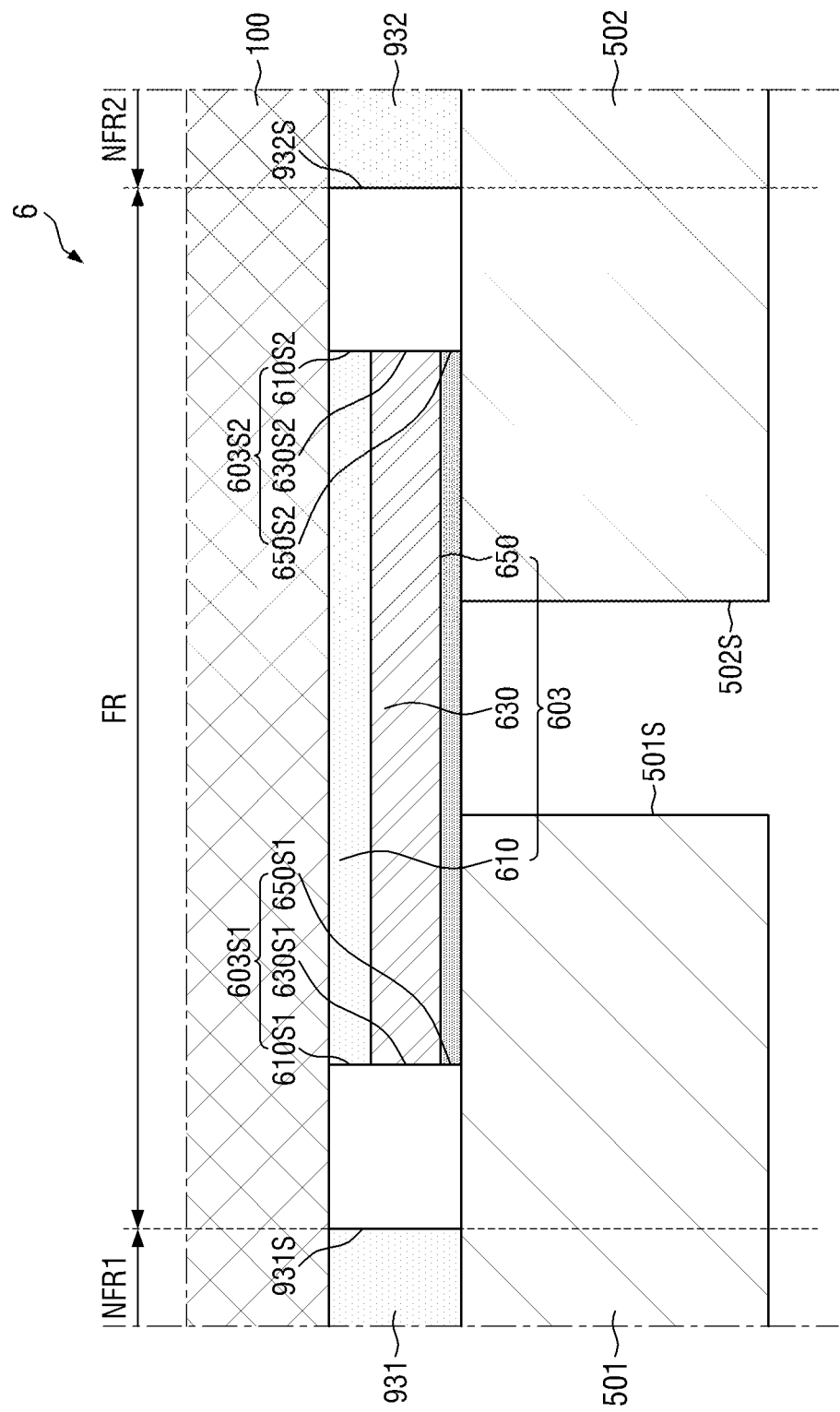
FIG. 16 is a view illustrating a lower surface (or a back surface) of a display module of the display device according to an alternative embodiment.
Figure 17:
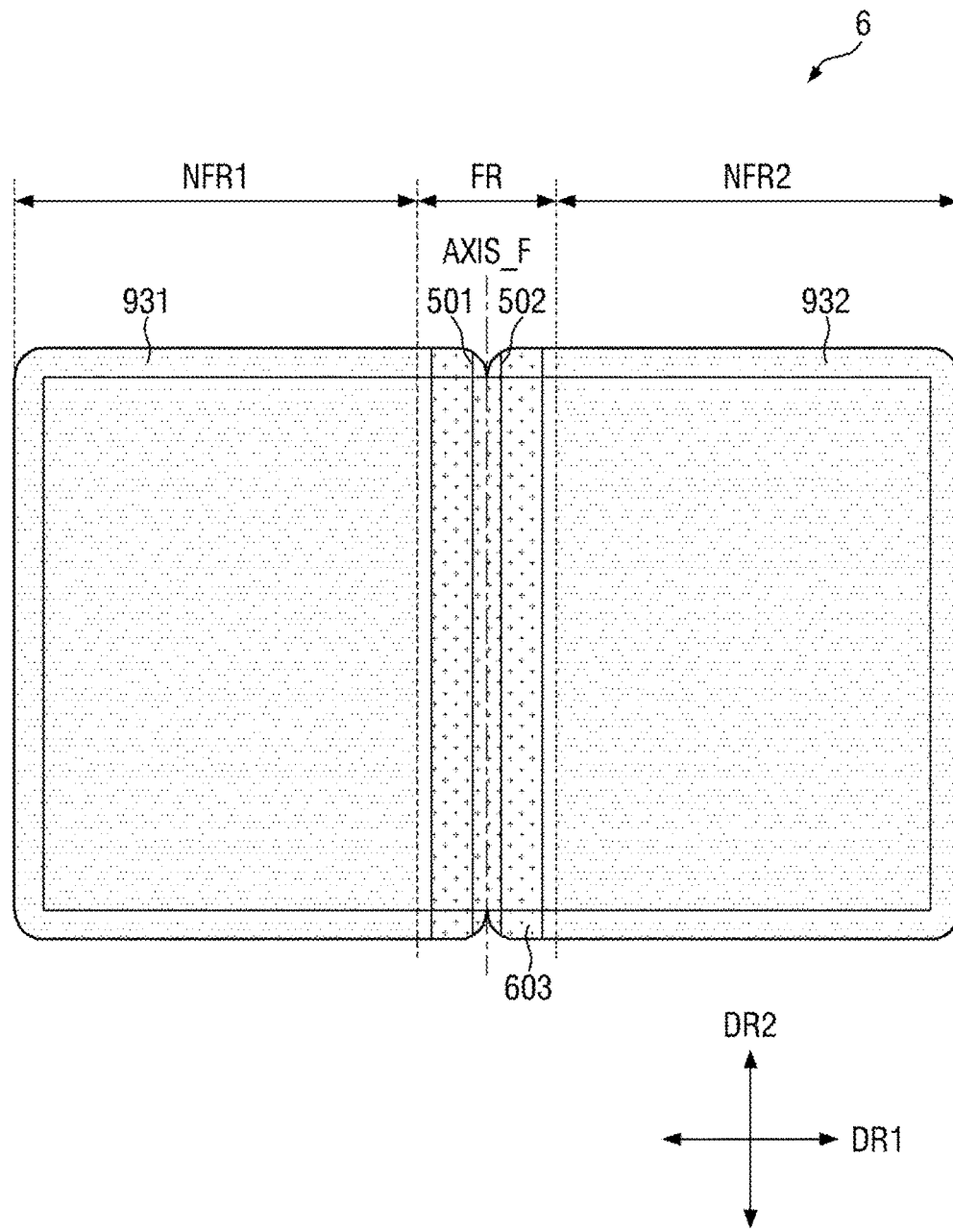
FIG. 17 is a plan view of the display device according to an alternative embodiment.
Figure 18:
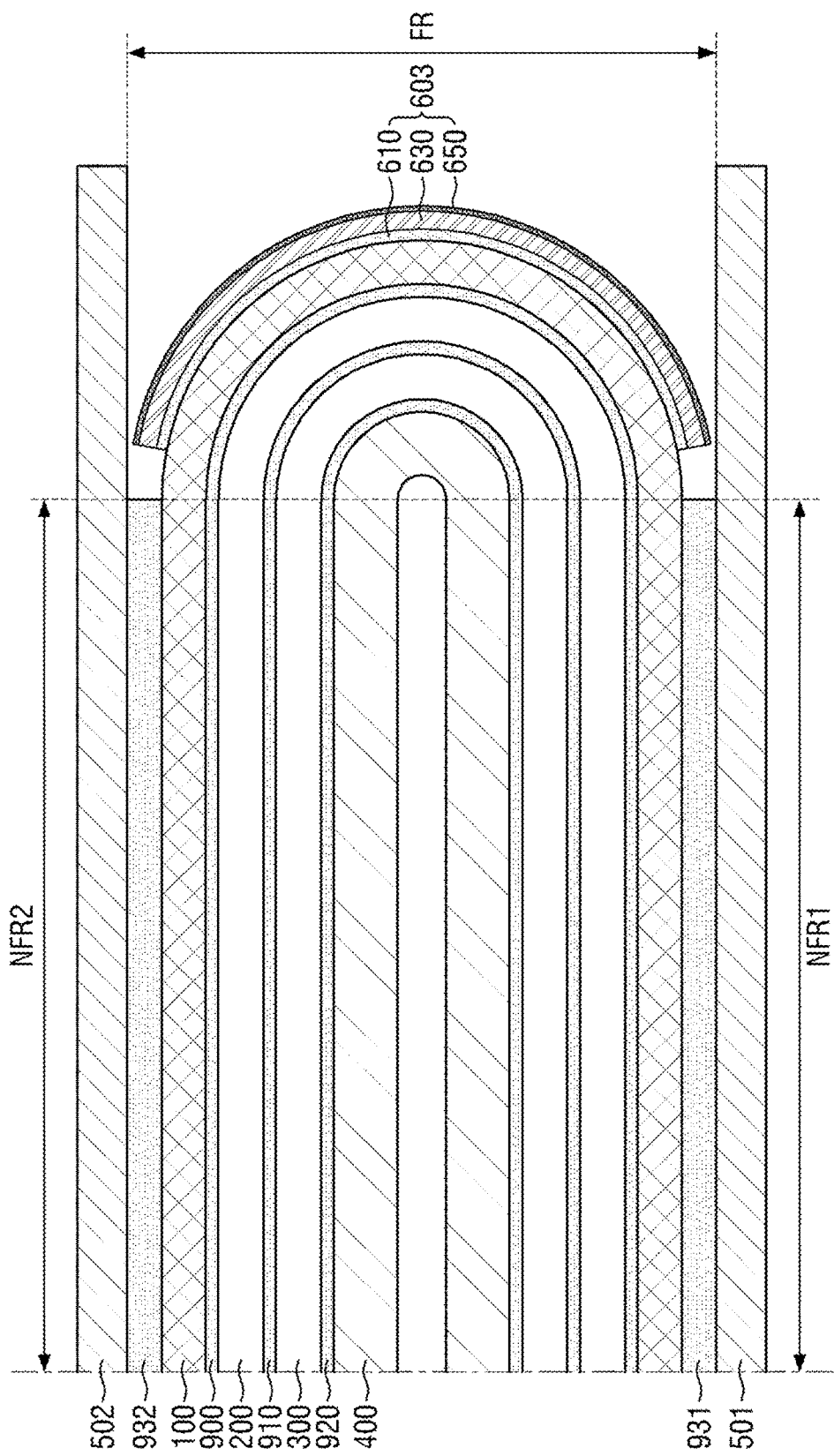
FIG. 18 is a view illustrating a folded state of the display device according to an alternative embodiment.
Figure 19:
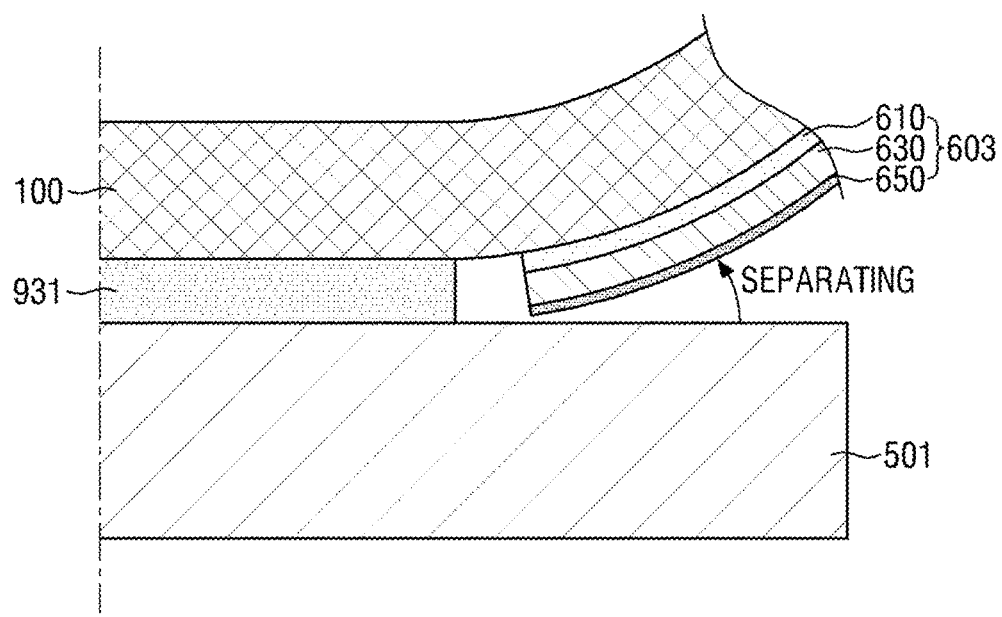
FIG. 19 is a view illustrating changing of a state of the display device from an unfolded state to a folded state according to an alternative embodiment.

FIG. 15 is a cross-sectional view of a display device according to an alternative embodiment, FIG. 16 is a view illustrating a lower surface (or a back surface) of a display module of the display device according to an alternative embodiment, FIG. 17 is a plan view of the display device according to an alternative embodiment, FIG. 18 is a view illustrating a folded state of the display device according to an alternative embodiment, and FIG. 19 is a view illustrating changing of a state of the display device from an unfolded state to a folded state according to an alternative embodiment.

Referring to FIGS. 15 to 19, in an alternative embodiment of a display device 6, a step compensating member 603 is attached to a lower cover panel 100 and detached from support plates 501 and 502 when the display device 6 is folded.

In such an embodiment, as shown in FIGS. 15 and 16, the step compensating member 603 may be disposed between support plates 501 and 502 and the lower cover panel 100. The step compensating member 603 may be integrally formed as a single or unitary body in a folding region FR. In such an embodiment, the step compensating member 603 may be disposed to overlap not only a region exposed by first and second plate coupling films 931 and 932 of the support plates 501 and 502 but also a separation space between inner side surfaces 501S and 502S of the support plates 501 and 502 in a thickness direction.

In an embodiment, as illustrated in FIG. 16, the step compensating member 603 may include a plurality of stacked films. In such an embodiment, the step compensating member 603 may include a first step compensating coupling film 610, a step compensating substrate 630, and a light shielding layer 650.

First inner side surfaces 610S1, 630S1 and 650S1 of the first step compensating coupling film 610, the step compensating substrate 630 and the light shielding layer 650 may be aligned with each other in the thickness direction, and second inner side surfaces 610S2, 630S2 and 650S2 thereof may be aligned with each other in the thickness direction, but embodiments are not limited thereto.

Inner side surfaces 603S1 and 603S2 of the step compensating member 603 respectively face inner side surfaces 931S and 932S of first and second plate coupling films 931 and 932 and are spaced apart from each other at a predetermined distance. In an embodiment, a separation distance between the inner side surfaces 603S1 and 603S2 of the step compensating member 603 and the inner side surfaces 931S and 932S of the first and second plate coupling films 931 and 932 is in a range of about 100 µm to 300 µm.

In an embodiment, as illustrated in FIG. 17, the step compensating member 603 may have a linear shape extending in the extending direction of the folding axis AXIS_F (the second direction DR2). The step compensating member 603 may extend from one to the other of both long side edges of the display device 6 by crossing the long side edges, but embodiments are not limited thereto. The step compensating member 603 may extend to an extent that the step compensating function may be smoothly performed by sufficiently filling separation spaces between the lower cover panel 100 and the support plates 501 and 502 in the folding region FR and may not extend to the both long side edges of the display device 6.

A first step compensating coupling film 610 of the step compensating member 603 may be integrally formed as a single or unitary body between the lower cover panel 100 and the support plates 501 and 502. The first step compensating coupling film 610 serves to couple the lower cover panel 100 to the step compensating substrate 630 of the step compensating member 603 disposed therebelow. The first step compensating coupling film 610 may include a same material as that of the first and second plate coupling films 931 and 932 described above. In one embodiment, for example, the first step compensating coupling film 610 may include the PSA.

A elastic modulus of the first step compensating coupling film 610 may be substantially the same as elastic moduli of the first and second plate coupling films 931 and 932. In one embodiment, for example, the elastic modulus of the first step compensating coupling film 610 may be in a range of about 0.04 MPa to about 0.06 MPa at room temperature (about 23° C. to 25° C.). When the display device 6 is folded, as illustrated in FIG. 18, not only the first step compensating coupling film 610 but also the step compensating substrate 630 coupled to the first step compensating coupling film 610 is bent in the folding region FR. In such an embodiment, since the elastic modulus (or viscosity) of the step compensating substrate 630 is relatively high, the overall stress of the step compensating member 603 in the folding region FR may be high. Accordingly, in an alternative embodiment, the overall stress of the step compensating member 603 may be minimized by forming the elastic modulus of the first step compensating coupling film 610 to be lower than about 0.04 MPa.

The step compensating substrate 630 may be disposed between the first step compensating coupling film 610 and the light shielding layer 650 and integrally formed as a single or unitary body, and may include at least one of the materials listed above as the materials constituting the step compensating substrates 631 and 632 described above with reference to FIG. 3.

The light shielding layer 650 may be disposed between the step compensating substrate 630 and the support plates 501 and 502. The light shielding layer 650 may be directly provided or formed on surface of the step compensating substrate 630 facing the support plates 501 and 502. The light shielding layer 650 may include the same material as those of the light shielding layers 651 and 652 described above with reference to FIG. 3.

In an embodiment, the thickness of each of the first and second plate coupling films 931 and 932 described above and the thickness of the step compensating member 603 shown in FIGS. 15 to 19 may be substantially the same as each other. In such an embodiment, a thickness relationship among the configurations 610, 630 and 650 of the step compensating member 603 is substantially the same as or similar to that described above with reference to FIG. 3, and any repetitive detailed description thereof will be omitted.

In an embodiment, a coupling force between the step compensating member 603 and the lower cover panel 100 thereabove may be greater than a coupling force between the step compensating member 603 and the support plates 501 and 502. In such an embodiment, a fifth coupling force between the step compensating member 603 and the lower cover panel 100 may be greater than the sum of a sixth coupling force between the step compensating member 603 and the first support plate 501 and a seventh coupling force between the step compensating member 603 and the second support plate 502.

In such an embodiment, as described above, since the first step compensating coupling film 610 couples the step compensating substrate 630 and the lower cover panel 100 thereabove to each other and the light shielding layer 650 is directly formed on the surface of the step compensating substrate 630 facing the support plates 501 and 502, overall, the coupling force between the step compensating member 603 and the lower cover panel 100 is greater than the coupling force between the step compensating member 603 and the support plates 501 and 502. In an embodiment, the step compensating member 603 may be formed by being printed on the lower cover panel 100 instead of being transferred to the support plates 501 and 502 due to the above-described differences between the coupling forces of the configurations, during operation of folding the display device 6.

Hereinafter, operation of such an embodiment of the display device 6 will be described in detail with reference to FIGS. 18 and 19.

As described above with reference to FIGS. 5 and 6, it is desirable that the support plates 501 and 502 and a display module 10_1 not be adhered to each other in the folding region FR. In an embodiment, the step compensating member 603 transferred to the lower cover panel 100 when the display device 6 is folded may be disposed in the folding region FR of the support plates 501 and 502. Therefore, direct coupling between the support plates 501 and 502 and the display module 10_1 may not occur in the folding region FR.

In an embodiment, as described above, since the coupling force between the step compensating member 603 and the lower cover panel 100 is higher than the coupling force between the step compensating member 603 and the support plates 501 and 502, the step compensating member 603 is attached to the lower cover panel 100 but is separated from the support plates 501 and 502 therebelow in the state in which the display device 6 is folded.

In such an embodiment, during the operation of folding the display device 6, the first step compensating coupling film 610, the step compensating substrate 630 and the light shielding layers 650 may be coupled to the lower cover panel 100 but separated from the support plates 501 and 502.

Figure 20:
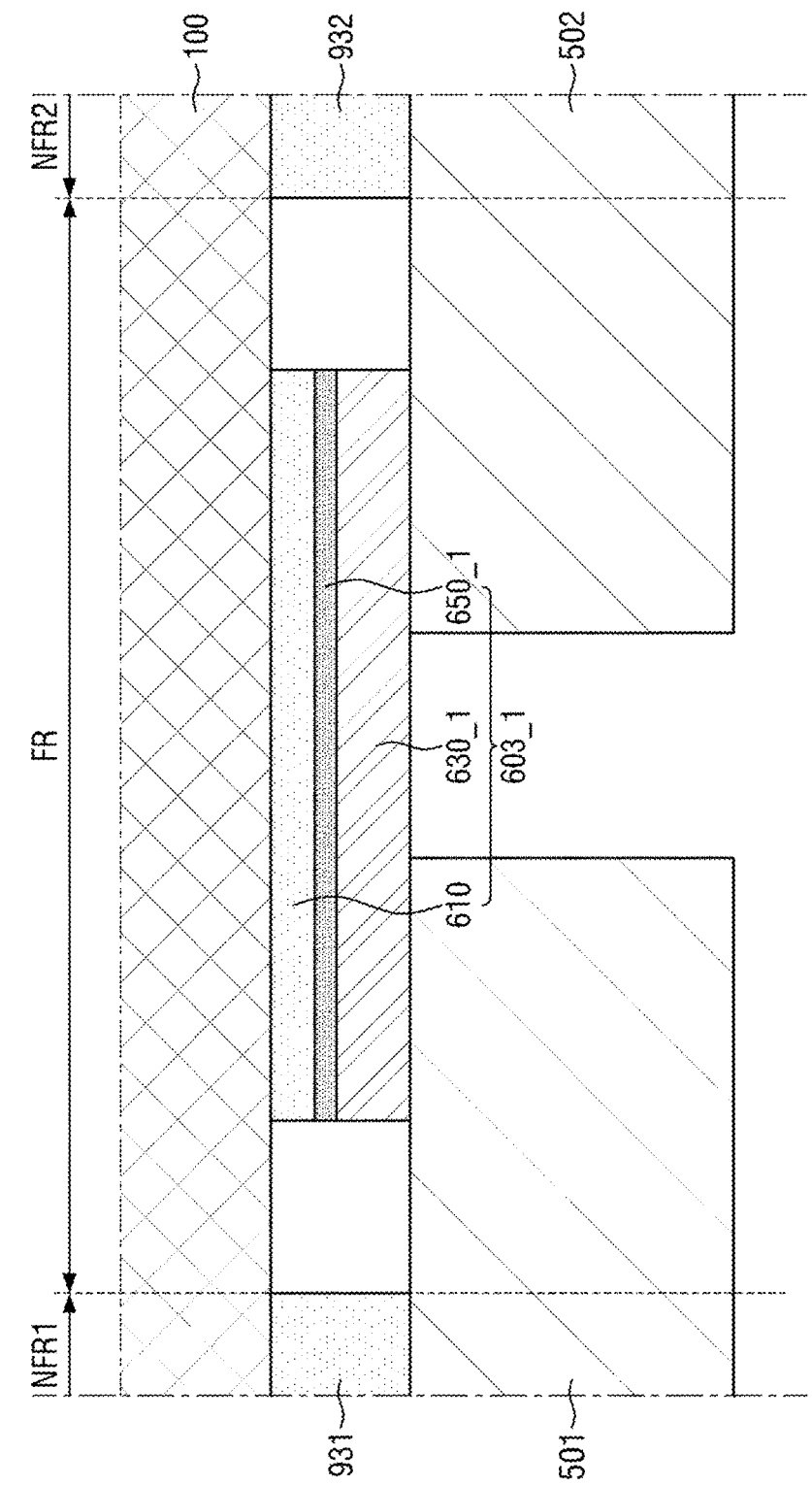
FIG. 20 is a view illustrating a lower surface (or a back surface) of a display module of a display device according to another alternative embodiment.

FIG. 20 is a view illustrating a lower surface (or a back surface) of a display module of a display device according to yet another alternative embodiment.

Referring to FIG. 20, in such an embodiment of a display device 7, a step compensating member 603_1 is different from the step compensating member 603 described above with reference to FIG. 16 in that a light shielding layer 650_1 of the step compensating member 603_1 is disposed between a first step compensating coupling films 610 and a step compensating substrate 630_1.

In such an embodiment, the light shielding layer 650_1 may be disposed between the first step compensating coupling film 610 and the step compensating substrate 630_1 and attached to a lower cover panel 100 by the first step compensating coupling film 610. In such an embodiment, the step compensating substrate 630_1 is disposed between the light shielding layer 650_1 and support plates 501 and 502.

The light shielding layer 650_1 may be directly provided or formed on a surface of the step compensating substrate 630_1 facing the lower cover panel 100 such that a coupling force between the step compensating substrate 630_1 and the light shielding layer 650_1 is greater than a coupling force between the step compensating substrate 630_1 and the support plates 501 and 502. However, embodiments are not limited thereto, and alternatively, the light shielding layer 650_1 may also be directly formed on one surface of the first step compensating coupling film 610 facing the support plates 501 and 502. In such an embodiment, to allow the step compensating member 603_1 to be detached from the support plates 501 and 502 when the display device 7 is folded, upper and lower surfaces of the step compensating substrate 630_1 may be treated to have different attachment properties from each other in a way such that the coupling force between the step compensating substrate 630_1 and the light shielding layer 650_1 is greater than the coupling force between the step compensating substrate 630_1 and the support plates 501 and 502.

Figure 21:
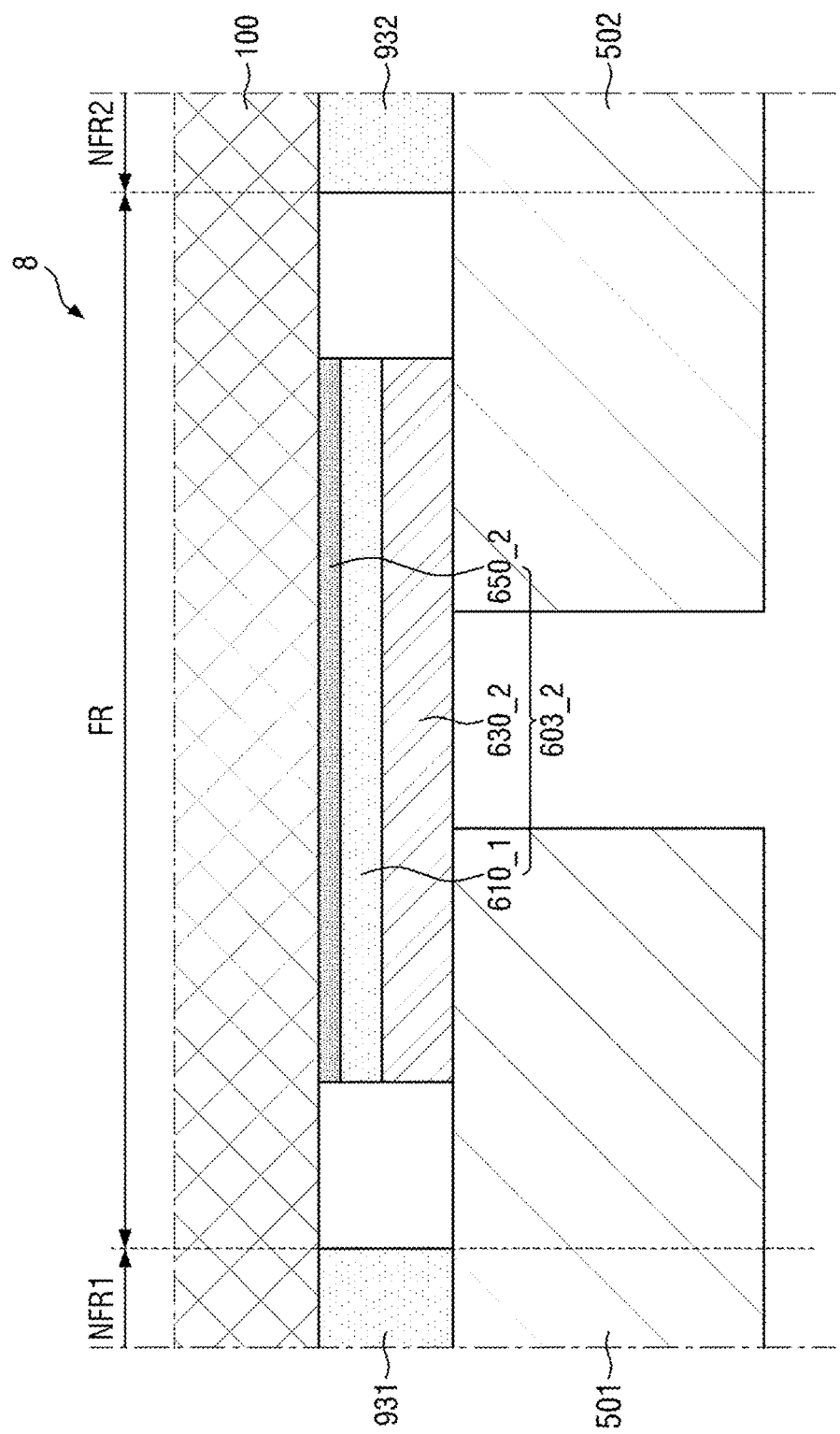
FIG. 21 is a view illustrating a lower surface (or a back surface) of a display module of a display device according to yet another alternative embodiment.

FIG. 21 is a view illustrating a lower surface (or a back surface) of a display module of a display device according to yet another alternative embodiment.

Referring to FIG. 21, in an embodiment of a display device 8, a step compensating member 603_2 is different from the step compensating member 603 described above with reference to FIG. 16 in that a light shielding layer 650_2 of the step compensating member 603_2 is disposed between a lower cover panel 100 and a first step compensating coupling film 610_1.

In such an embodiment, the light shielding layer 650_2 may be disposed between the lower cover panel 100 and the first step compensating coupling film 610_1, and the first step compensating coupling film 610_1 may be disposed between the light shielding layer 650_2 and a step compensating substrate 630_2 and couple the light shielding layer 650_2 and the step compensating substrate 630_2 to each other. In such an embodiment, the step compensating substrate 630_2 may be disposed between the first step compensating coupling film 610_1 and support plates 501 and 502.

The light shielding layer 650_2 may be directly provide or formed on a surface of the lower cover panel 100 facing the support plates 501 and 502, but embodiments are not limited thereto. Alternatively, the light shielding layer 650_2 may be directly formed on a surface of the first step compensating coupling film 610_1 facing the lower cover panel 100.

In such an embodiment, since the step compensating member 603_2 is attached to the lower cover panel 100 and separated from the support plates 501 and 502 when the display device 8 is folded, surface-treatment may be performed on the surfaces even in the case in which the light shielding layer 650_2 is directly formed on the first step compensating coupling film 610_1, to improve an attachment property of the surface such that the light shielding layer 650_2 is not separated from the lower cover panel 100 when the display device 8 is folded.

Figure 22:
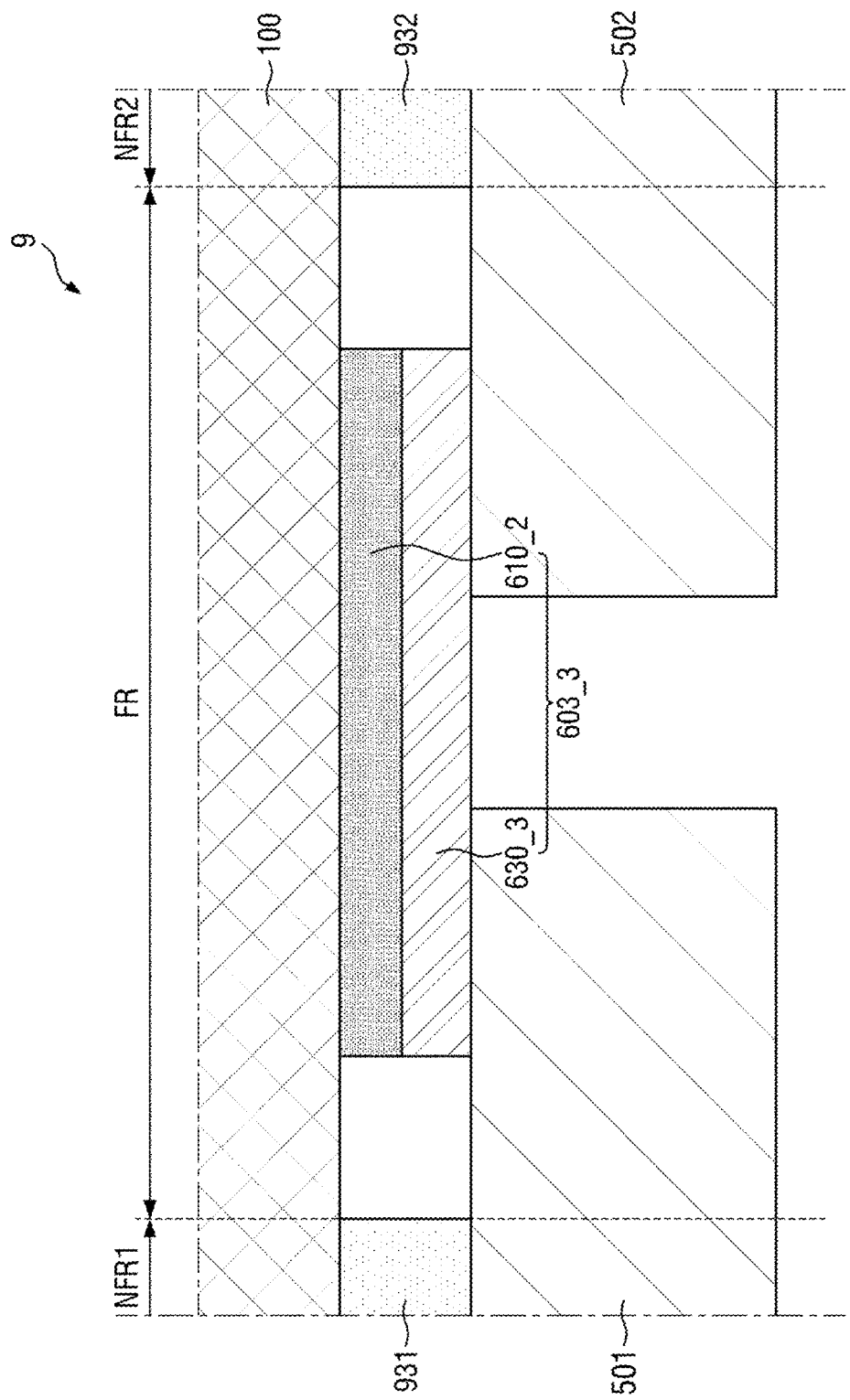
FIG. 22 is a view illustrating a lower surface (or a back surface) of a display module of a display device according to yet another alternative embodiment.

FIG. 22 is a view illustrating a lower surface (or a back surface) of a display module of a display device according to yet another alternative embodiment.

Referring to FIG. 22, in an embodiment of a display device 9, a step compensating member 603_3 is different from the step compensating member 603 described above with reference to FIG. 16 in that a first step compensating coupling film 610_2 of the step compensating member 603_3 is formed using a material constituting a light shielding layer.

In such an embodiment, the first step compensating coupling film 610_2 may be disposed between a step compensating substrate 630_3 and a lower cover panel 100 and may include a material constituting the light shielding layer. The material constituting the light shielding layer may be at least one of the above-mentioned light absorbing materials.

Figure 23:
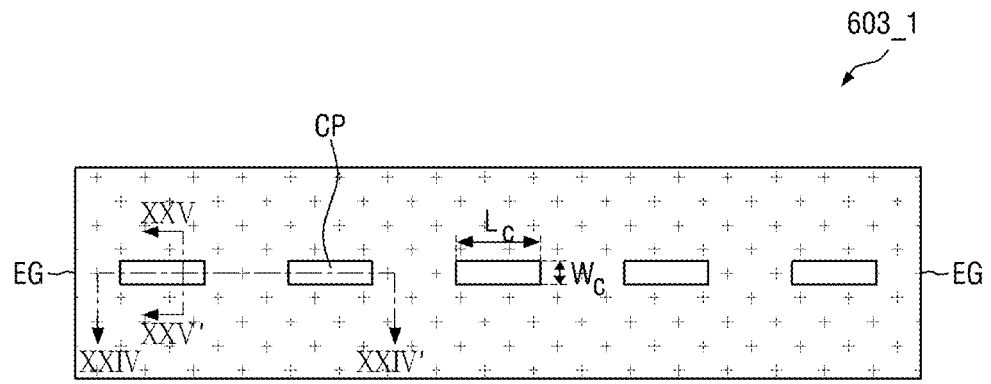
FIG. 23 is a plan view of a step compensating member according to yet another alternative embodiment.
Figure 24:
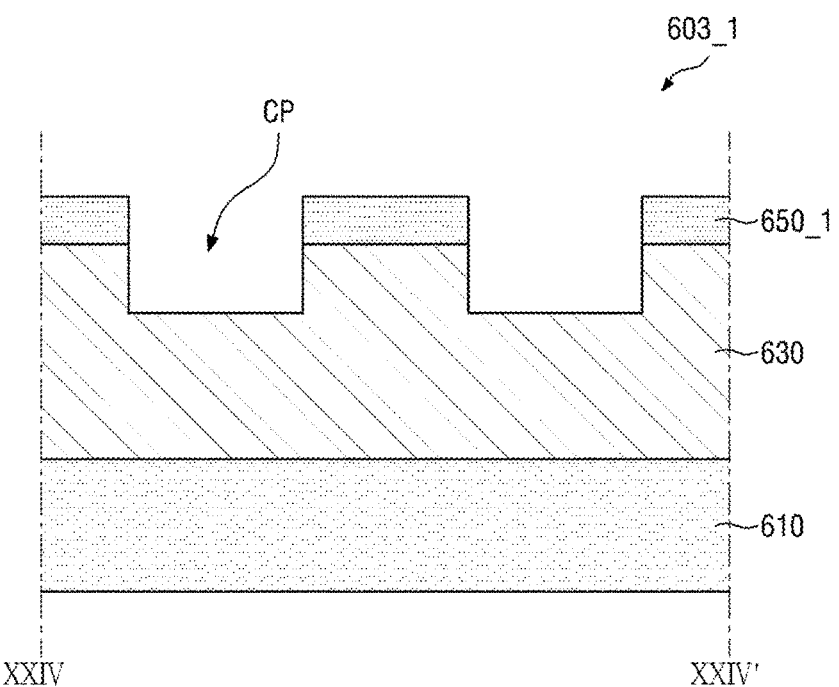
FIG. 24 is a cross-sectional view taken along line XXIV-XXIV' of FIG. 23.
Figure 25:
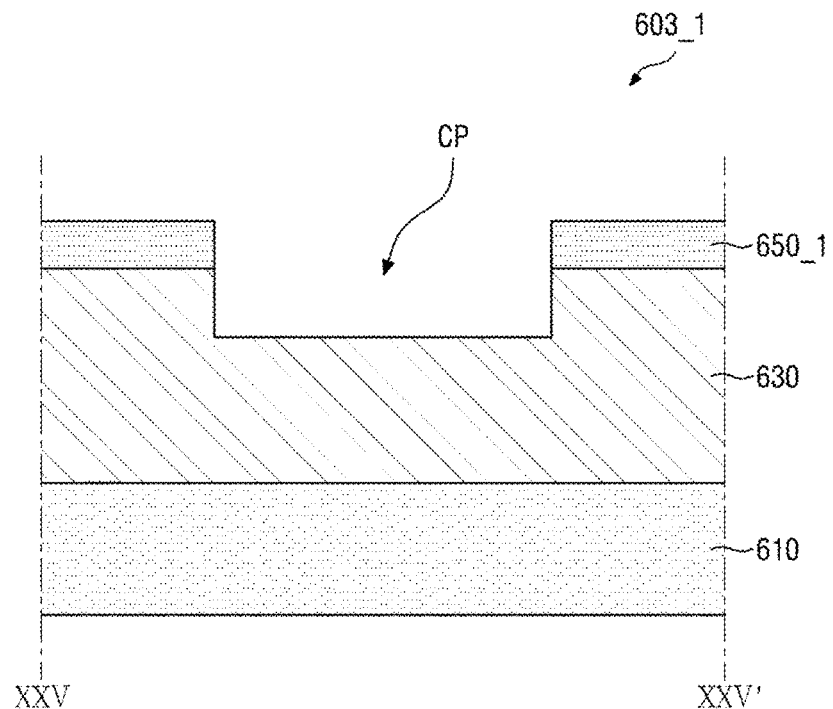
FIG. 25 is a cross-sectional view taken along line XXV-XXV' of FIG. 23.

FIG. 23 is a plan view of a step compensating member according to yet another alternative embodiment, FIG. 24 is a cross-sectional view taken along line XXIV-XXIV' of FIG. 23, and FIG. 25 is a cross-sectional view taken along line XXV-XXV' of FIG. 23. FIG. 23 illustrates a modified planar shape of the step compensating member 603 of FIG. 17. For convenience of description, FIGS. 24 and 25 illustrate a case in which the stacked structure of the step compensating member 603_1 is opposite to that of the step compensating member 603 shown in FIGS. 15 to 19.

For convenience of illustration and description, FIGS. 23 to 25 show an embodiment where the planar shape of the step compensating member 603_1 may be a rectangular shape, which includes two long sides extending in the second direction DR2 and two short sides extending in the first direction DR1, but embodiments are not limited thereto.

In an embodiment, the step compensating member 603_1 includes a plurality of cutting patterns CP extending in a direction in which the step compensating member 603_1 extends. When the display device is folded, the step compensating member 603_1 is folded along a central line of the both short sides (for example, the folding axis AXIS_F), and each cutting pattern CP has a predetermined length $L_C$ in the direction in which the step compensating member 603_1 extends and partially separates a surface of the step compensating member 603_1. Accordingly, in such an embodiment, flexibility of the step compensating member 603_1 may be further improved. In such an embodiment, each cutting pattern CP also extends in a direction that intersects the direction in which the step compensating member 603_1 extends, and has a predetermined width $W_C$. Accordingly, in such an embodiment, flexibility of the step compensating member 603_1 may be further improved as the width $W_C$ of each cutting pattern CP is greater. However, the length $L_C$ of the cutting pattern CP has a more significant influence on securing the flexibility. In an embodiment, the length $L_C$ of the cutting pattern CP may be greater than the width $W_C$ thereof.

Each of the length $L_C$ of each cutting pattern CP extending in the second direction DR2 and the width We of each cutting pattern CP extending in the first direction DR1 may have a size that allows sufficient flexibility of the step compensating member 603_1 to be secured.

In the plan view, each cutting pattern CP may be completely surrounded by a material constituting the step compensating member 603_1 as illustrated in FIG. 23. In such an embodiment, the step compensating member 603_1 is integrally formed as a single or unitary body.

In an embodiment, as shown in FIG. 23, five cutting patterns CP may be provided, but embodiments are not limited thereto. Alternatively, the number of the cutting patterns CP may be one to four or greater than five.

The cutting pattern CP has a shape crossing one surface (or a surface) of the step compensating member 603_1 facing support plates 501 and 502 in a thickness direction.

In an embodiment, as illustrated in FIGS. 24 and 25, the cutting pattern CP may completely cross a light shielding layer 650_1 from a surface of the light shielding layer 650_1, partially cross a step compensating substrate 630, and terminate inside the step compensating substrate 630. In such an embodiment, a bottom surface of the cutting pattern CP may be present inside the step compensating substrate 630.

Figure 26:
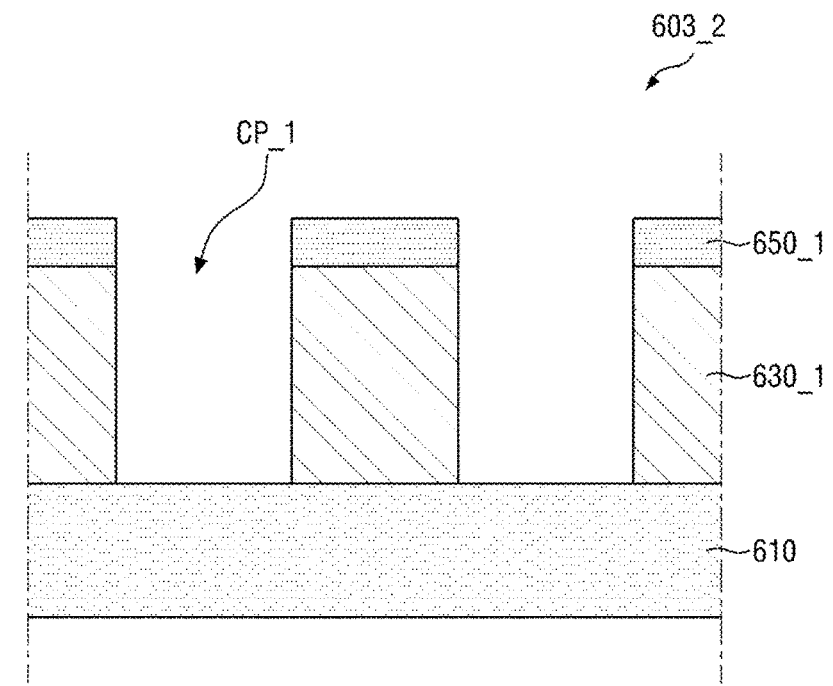
FIG. 26 is a cross-sectional view of a step compensating member according to yet another alternative embodiment.

FIG. 26 is a cross-sectional view of a step compensating member according to yet another alternative embodiment.

Referring to FIG. 26, an embodiment of a step compensating member 603_2 is different from the embodiments of the step compensating member 603_1 described above with reference to FIGS. 23 to 25 in that a cutting pattern CP_1 completely crosses a light shielding layer 650_1 and a step compensating substrate 630_1 in a thickness direction from a surface of the light shielding layer 650_1.

In such an embodiment, a bottom surface of the cutting pattern CP_1 may be present on a first step compensating coupling film 610. In such an embodiment, the step compensating member 603_2 may have more improved flexibility when the display device is folded.

Figure 27:
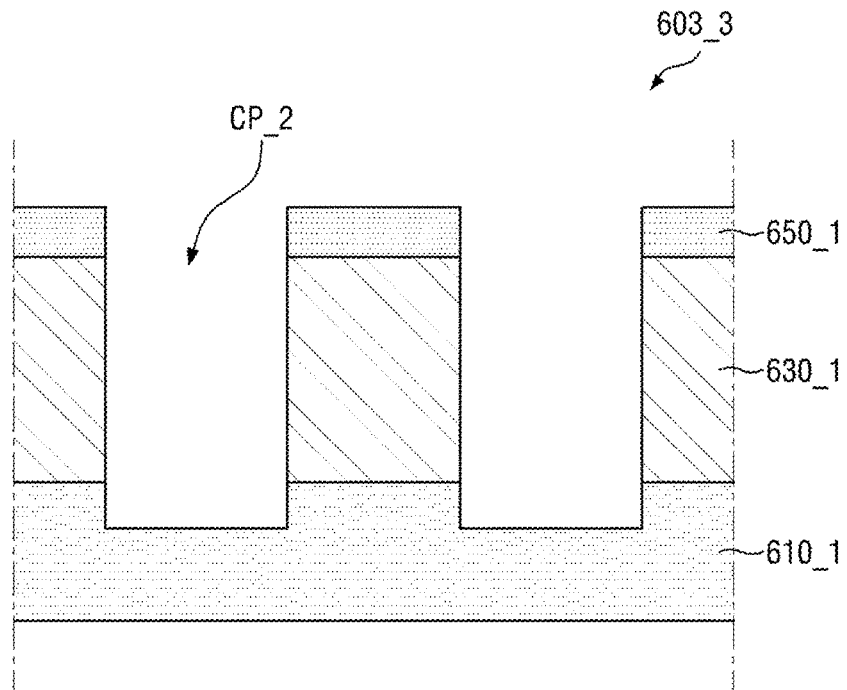
FIG. 27 is a cross-sectional view of a step compensating member according to yet another alternative embodiment.

FIG. 27 is a cross-sectional view of a step compensating member according to yet another alternative embodiment.

Referring to FIG. 27, an embodiment of a step compensating member 603_3 is different from the embodiments of the step compensating member 603_1 described above with reference to FIGS. 23 to 25 in that a cutting pattern CP_2 completely crosses a light shielding layer 650_1 and a step compensating substrate 630_1 in the thickness direction from the surface of the light shielding layer 650_1 and partially crosses a first step compensating coupling film 610_1.

In such an embodiment, a bottom surface of the cutting pattern CP_2 may be present inside the first step compensating coupling film 610_1. In such an embodiment, the step compensating member 603_3 may have more improved flexibility when the display device is folded.

Figure 28:
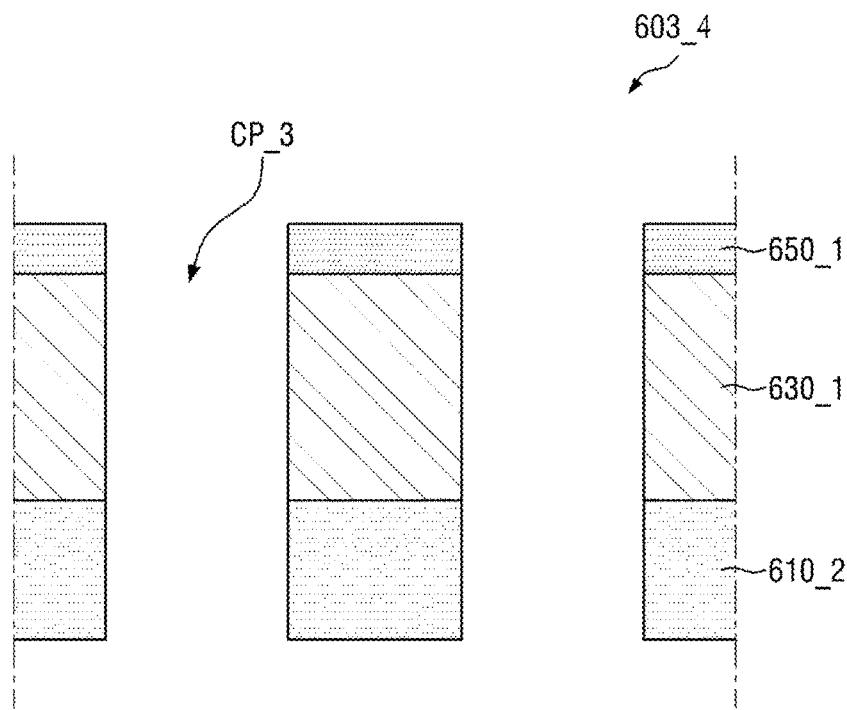
FIG. 28 is a cross-sectional view of a step compensating member according to yet another alternative embodiment.

FIG. 28 is a cross-sectional view of a step compensating member according to yet another alternative embodiment.

Referring to FIG. 28, an embodiment of a step compensating member 603_4 is different from the embodiments of the step compensating member 603_1 described above with reference to FIGS. 23 to 25 in that a cutting pattern CP_3 completely crosses a light shielding layer 650_1, a step compensating substrate 630_1, and a first step compensating coupling film 610_2 in a thickness direction from the surface of the light shielding layer 650_1.

In such an embodiment, a bottom surface of the cutting pattern CP_3 may be parallel to or corresponding to a bottom surface of the first step compensating coupling film 610_2. In such an embodiment, the step compensating member 603_4 may have more improved flexibility when the display device is folded.

Figure 29:
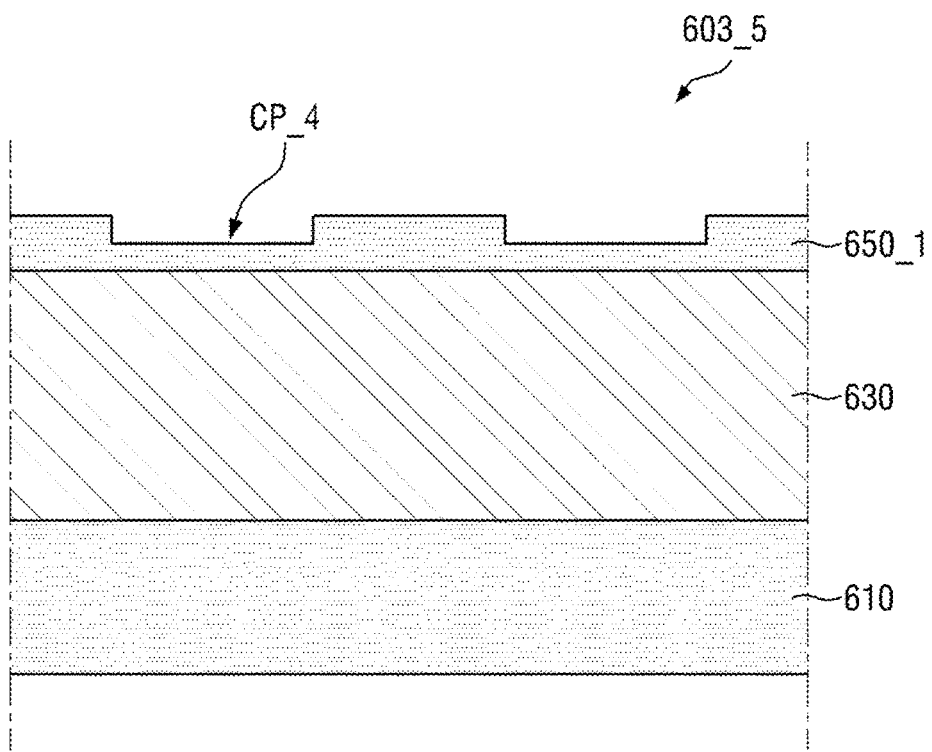
FIG. 29 is a cross-sectional view of a step compensating member according to yet another alternative embodiment.

FIG. 29 is a cross-sectional view of a step compensating member according to yet another alternative embodiment.

Referring to FIG. 29, an embodiment of a step compensating member 603_5 is different from the embodiments of the step compensating member 603_1 described above with reference to FIGS. 23 to 25 in that a cutting pattern CP_4 partially crosses a light shielding layer 650_1 in a thickness direction from the surface of the light shielding layer 650_1.

FIG. 30 is a plan view of a step compensating member according to yet another alternative embodiment.

An embodiment of a step compensating member 603_6 shown in FIG. 30 is different from the embodiment of the step compensating member 603_1 shown in FIG. 23 in that a cutting pattern CP_5 includes a plurality of rows, in which cutting patterns CP_5 are arranged in the first direction DR1, arranged in the second direction DR2.

In such an embodiment, where the step compensating member 603_6 includes the plurality of rows of cutting patterns CP_5, flexibility of the step compensating member 603_6 may be further improved when the display device is folded.

FIG. 31 is a plan view of a step compensating member according to yet another alternative embodiment.

Referring to FIG. 31, an embodiment of a step compensating member 603_7 is different from the embodiment of the step compensating member 603_1 described above with reference to FIG. 23 in that cutting patterns CP_6 are arranged in a zigzag manner in the second direction DR2.

In such an embodiment, by securing a sufficient distance between one end of the cutting pattern CP_6 and one edge EG of the step compensating member 603_7 in a width direction thereof, flexibility of the step compensating member 603_7 may be improved when the display device is folded, and the step compensating member 603_7 may be more effectively formed as a single or unitary body.

Figure 32:
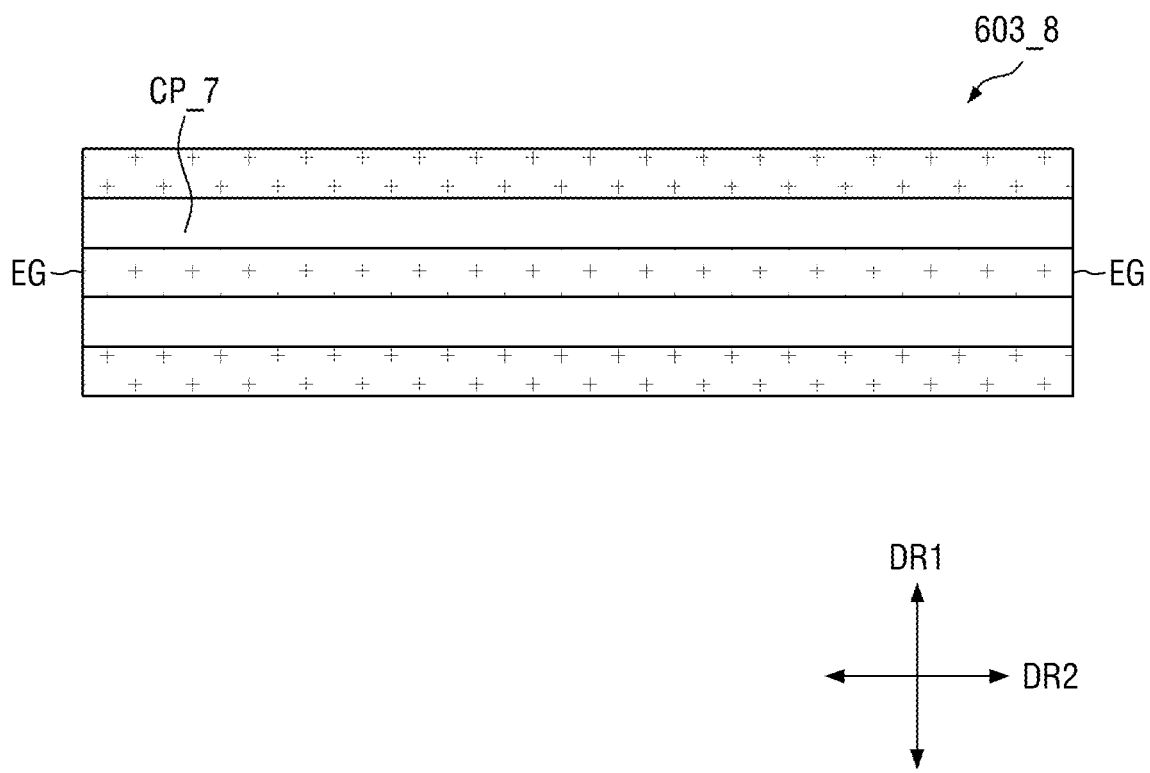
FIG. 32 is a plan view of a step compensating member according to yet another alternative embodiment.

FIG. 32 is a plan view of a step compensating member according to yet another alternative embodiment.

Referring to FIG. 32, in an embodiment, when viewed in the plan view, at least one end of a cutting pattern CP_7 of a step compensating member 603_8 may extend to one edge EG of the step compensating member 603_8 in a length direction thereof. In such an embodiment in which one end of the cutting pattern CP_7 extends to the edge EG of the step compensating member 603_8 in the length direction thereof, since the surface of the step compensating member 603_8 is not physically connected at the corresponding edge EG, flexibility of the separated step compensating member 603_8 may be increased. In such an embodiment in which both ends of the cutting pattern CP_7 extend to edges EG of the step compensating member 603_8 in the length direction thereof, that is, the cutting pattern CP_7 completely crosses the surface of the step compensating member 603_8 in the plan view, the flexibility of the step compensating member 603_8 may be further increased. In such an embodiment, an end surface structure integrally connected to the step compensating member 603_8 may be assembled to a lower portion of the step compensating member 603_8 as shown in FIGS. 22, 26 and 27, to improve handling efficiencies.

Figure 33A:
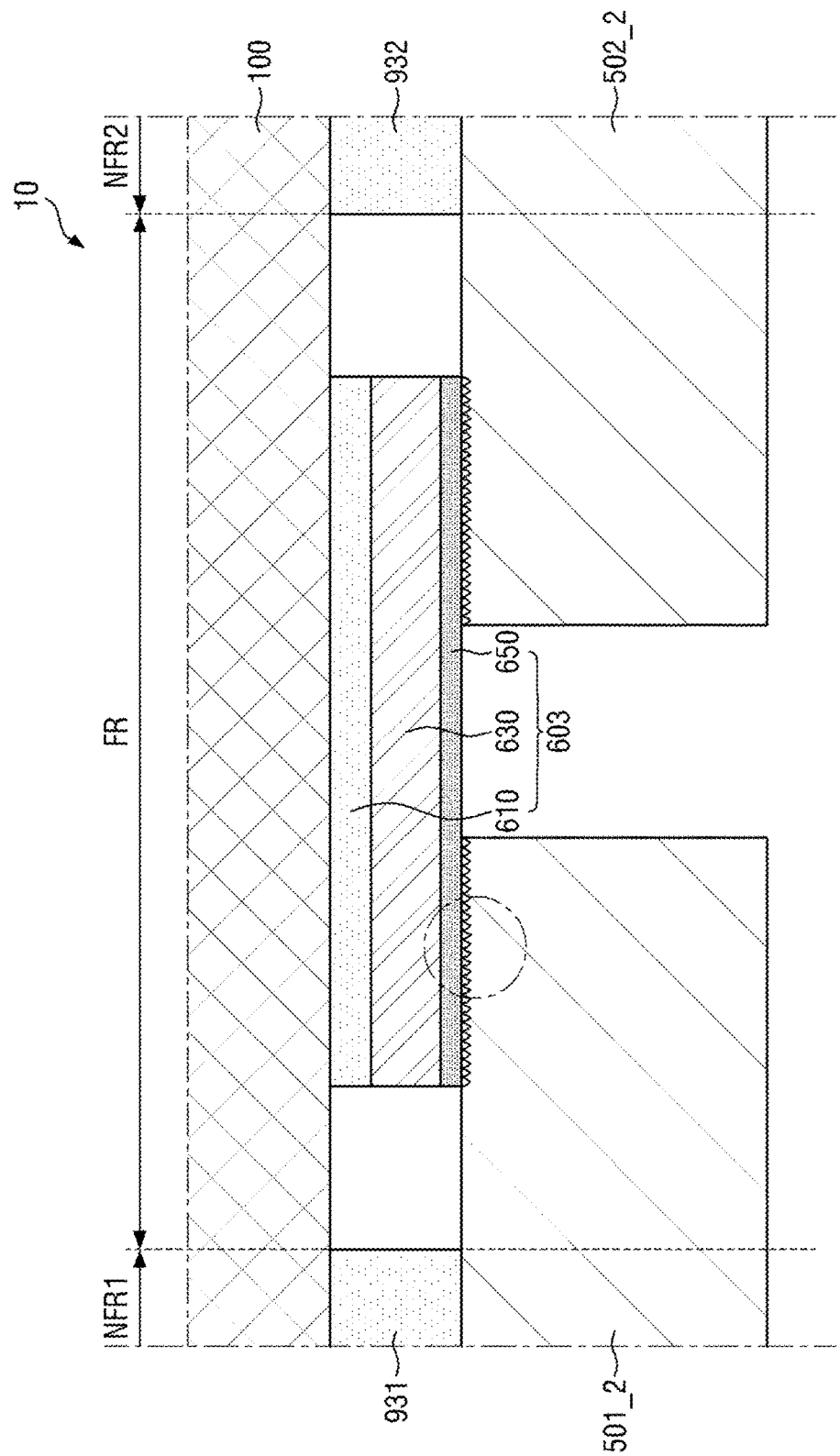
FIG. 33A is a view illustrating a lower surface (or a back surface) of a display module of a display device according to yet another alternative embodiment.
Figure 33B:
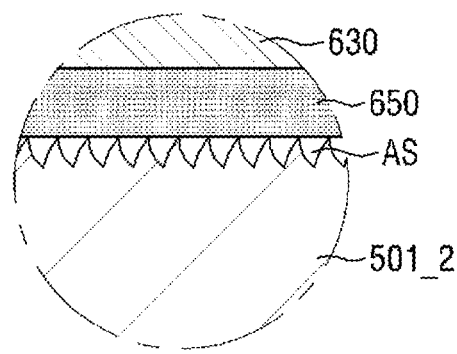
FIG. 33B is an enlarged view of the encircled portion of FIG. 33A.

FIG. 33A is a view illustrating a lower surface (or a back surface) of a display module of a display device according to yet another alternative embodiment, and FIG. 33B is an enlarged view of the encircled portion of FIG. 33A.

Referring to FIGS. 33A and 33B, an embodiment of a display device 10 is different from the embodiment of the display device 6 described above with reference to FIG. 16 in that surface treatment is performed on one surface of support plates 501_2 and 502_2 facing a lower cover panel 100.

The surface treatment may increase surface roughness of the one surface of the support plates 501_2 and 502_2. In an embodiment, the surface treatment may include thermal spray coating, for example.

Due to the surface treatment, an air gap region AS may be defined or formed between the support plates 501_2 and 502_2 and a light shielding layer 650 such that an attaching force between the light shielding layer 650 and the support plates 501_2 and 502_2 may be weakened. Therefore, during operation of folding the display device, the light shielding layer 650 may be more easily separated from the support plates 501_2 and 502_2.

Figure 34:
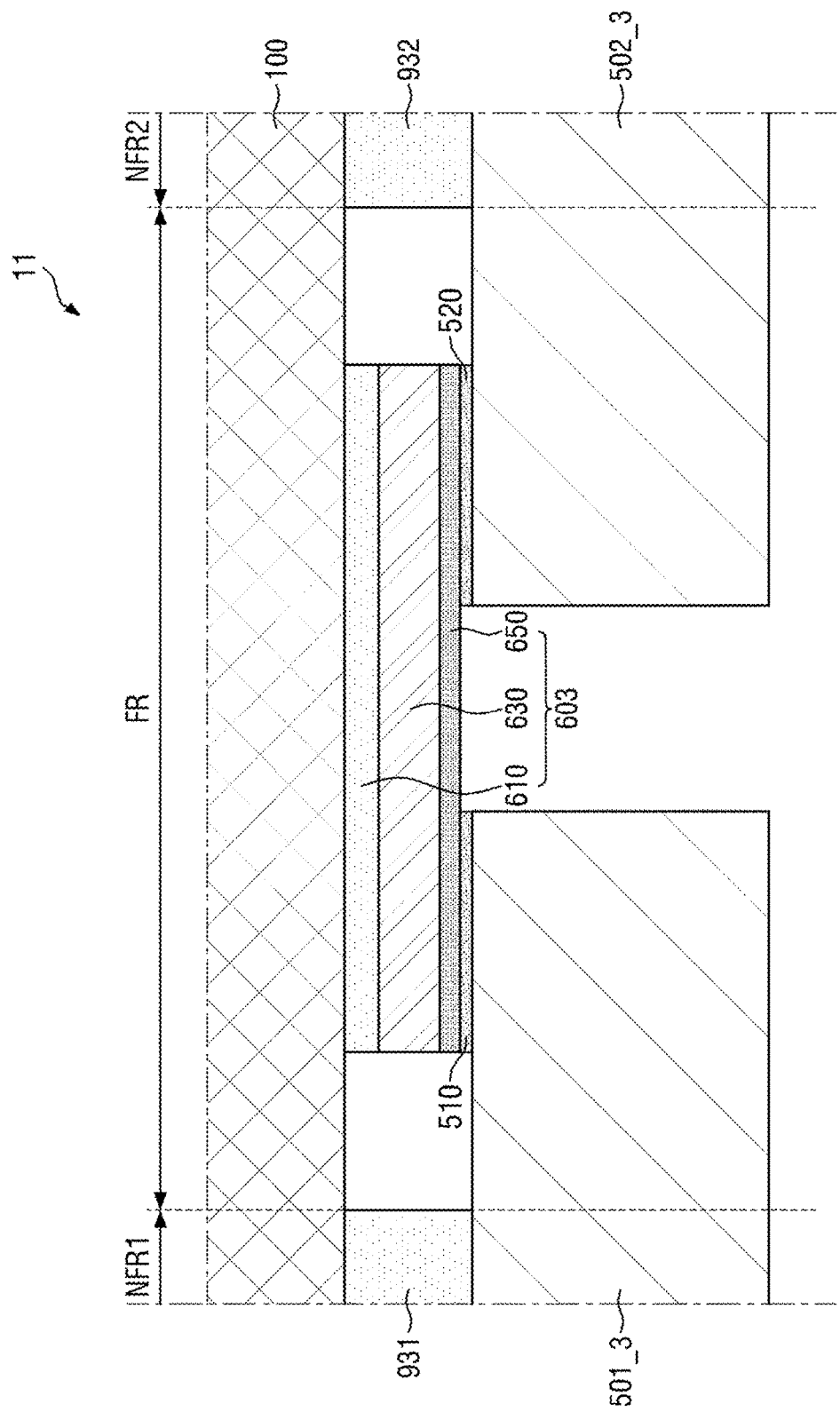
FIG. 34 is a view illustrating a lower surface (or a back surface) of a display module of a display device according to yet another alternative embodiment.

FIG. 34 is a view illustrating a lower surface (or a back surface) of a display module of a display device according to yet another alternative embodiment.

Referring to FIG. 34, in an embodiment of a display device 11, surface treatment may be performed on one surface of support plates 501_3 and 502_3 facing a lower cover panel 100 to improve detachability of the support plates 501_3 and 502_3 from a light shielding layer 650 disposed thereabove.

In an embodiment, the surface treatment may include a detaching treatment such as an olefin-based treatment, a silicone-based treatment, a long chain alkyl-based treatment, and a fluorine-based treatment, for example, but the surface treatment is not particularly limited. By the surface treatment, detaching patterns 510 and 520 is formed between the light shielding layer 650 and the support plates 501_3 and 502_3, respectively. The detaching patterns include olefin-based, silicone-based, long chain alkyl-based, or fluorine-based molecules. By the surface treatment, adhesiveness with olefin-based, silicone-based, long chain alkyl-based, or fluorine-based molecules as well as adhesiveness with a step compensating member 603 including the light shielding layer 650 that is disposed above the support plates 501_3 and 502_3 may be decreased at the surfaces of the support plates 501_3 and 502_3. In an embodiment, surface treatment that is substantially the same as or similar to invisible fingerprint ("IF") coating may be used as the surface treatment.

According to embodiments of the display device, pattern visibility in a folded or bent region may be eliminated or reduced.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display device comprising:
 a display panel including a folding region, a first non-folding region disposed at a side of the folding region, and a second non-folding region disposed at another other side of the folding region;
 a first support plate disposed below the display panel to overlap the first non-folding region and to partially overlap the folding region;

a second support plate disposed below the display panel to overlap the second non-folding region and to partially overlap the folding region;

a first coupling layer disposed between the display panel and the first support plate, wherein the first coupling layer couples the display panel and the first support plate to each other;

a second coupling layer disposed between the display panel and the second support plate, wherein the second coupling layer couples the display panel and the second support plate to each other;

a first step compensating member disposed between the display panel and the first support plate to overlap the folding region, and spaced apart from the first coupling layer, wherein the first step compensating member includes a first light shielding layer; and a second step compensating member disposed between the display panel and the second support plate to overlap the folding region, and spaced apart from the second coupling layer, wherein the second step compensating member includes a second light shielding layer.

2. The display device of claim 1, wherein the first coupling layer is disposed to overlap the first non-folding region, and the second coupling layer is disposed to overlap the second non-folding region.

3. The display device of claim 2, further comprising:

a lower cover panel disposed between the display panel and the first coupling layer to overlap the folding region, the first non-folding region, and the second non-folding region.

4. The display device of claim 3, wherein, when the display device is folded, the first non-folding region and the second non-folding region are disposed to overlap each other.

5. The display device of claim 4, wherein, when the display device is folded:

the first step compensating member is separated from the lower cover panel and attached to the first support plate; and the second step compensating member is separated from the lower cover panel and attached to the second support plate.

6. The display device of claim 2, wherein a separation distance between the first coupling layer and the second coupling layer is in a range of 7 millimeters to 8 millimeters.

7. The display device of claim 6, wherein a separation distance between the first coupling layer and a first side surface of the first step compensating member facing an inner side surface of the first coupling layer is in a range of 300 micrometers to 800 micrometers, and a separation distance between the second coupling layer and a first side surface of the second step compensating member facing an inner side surface of the second coupling layer is in a range of 300 micrometers to 800 micrometers.

8. The display device of claim 7, wherein a separation distance between a second side surface of the first step compensating member facing the first side surface thereof and a second side surface of the second step compensating member facing the first side surface thereof is in a range of 0.2 millimeter to 0.4 millimeter.

9. A display device comprising:

a display panel including a folding region, a first non-folding region disposed at a side of the folding region, and a second non-folding region disposed at another side of the folding region;

a first support plate disposed below the display panel to overlap the first non-folding region and to partially overlap the folding region;

a second support plate disposed below the display panel to overlap the second non-folding region and to partially overlap the folding region;

a first coupling layer disposed between the display panel and the first support plate, wherein the first coupling layer couples the display panel and the first support plate to each other;

a second coupling layer disposed between the display panel and the second support plate, wherein the second coupling layer couples the display panel and the second support plate to each other; and compensating member disposed between the display panel and the first support plate and the second support plate to overlap the folding region, and spaced apart from the first coupling layer and the second coupling layer, wherein the step compensating member is integrally formed as a single body, and includes a light shielding layer.

10. The display device of claim 9, wherein a first coupling layer is disposed to overlap the first non-folding region, and a second coupling layer is disposed to overlap the second non-folding region.

11. The display device of claim 9, wherein the first layer has a lyophobic characteristic with respect to the second layer, and wherein the first layer includes at least one of a polyimide, a polyamic acid, and a polysiloxane.

* * * * *